US012592361B2

(12) United States Patent
Martinez et al.

(10) Patent No.: US 12,592,361 B2
(45) Date of Patent: Mar. 31, 2026

(54) HYBRID HIGH-POWER AND BROADBAND VARIABLE IMPEDANCE MODULES

(71) Applicant: MKS Inc., Andover, MA (US)

(72) Inventors: Linnell Martinez, San Jose, CA (US);
JiAhn Lee, Yuseong-gu (KR);
Alexander Jurkov, Calgary (CA);
Jaechul Jung, Sejong (KR); Aaron Radomski, Conesus, NY (US)

(73) Assignee: MKS Inc., Andover, MA (US)

( * ) Notice: Subject to any disclaimer, the term of this patent is extended or adjusted under 35 U.S.C. 154(b) by 340 days.

(21) Appl. No.: 17/873,624

(22) Filed: Jul. 26, 2022

(65) Prior Publication Data

US 2023/0050119 A1 Feb. 16, 2023

Related U.S. Application Data

(60) Provisional application No. 63/231,861, filed on Aug. 11, 2021.

(51) Int. Cl.
*H01J 37/32* (2006.01)
*H03H 11/28* (2006.01)

(52) U.S. Cl.
CPC ....... *H01J 37/32183* (2013.01); *H03H 11/28* (2013.01)

(58) Field of Classification Search
CPC .......... H01J 37/32128; H01J 37/32174; H01J 37/32183; H01J 37/32926; H01J 37/32935
See application file for complete search history.

(56) References Cited

U.S. PATENT DOCUMENTS

| | | | |
|---|---|---|---|
| 5,751,585 A | 5/1998 | Cutler et al. | |
| 7,602,127 B2 | 10/2009 | Coumou | |

(Continued)

FOREIGN PATENT DOCUMENTS

| | | |
|---|---|---|
| JP | 2008181846 | 8/2008 |
| JP | 2012142285 | 7/2012 |

(Continued)

OTHER PUBLICATIONS

Taiwanese Office Action regarding Patent Application No. 111130175, mailed Apr. 1, 2024.

(Continued)

*Primary Examiner* — Tung X Le
(74) *Attorney, Agent, or Firm* — Kurt Eaton

(57) ABSTRACT

A power supply system includes a RF generator, a matching network, and a control module. The matching network includes at least one mechanically variable impedance element and at least one electrically variable impedance element. The control module is coupled to the matching network and configured to generate one or more signals to adjust at least one of an impedance of the mechanically variable impedance element or an impedance of the electrically variable impedance element to vary an impedance match between the generator and a load. In other examples, a hybrid variable impedance module includes at least one mechanically variable impedance element, at least one electrically variable impedance element, and a control module. The control module is configured to generate one or more signals to adjust at least one of an impedance of the mechanically variable impedance element or an impedance of the electrically variable impedance element.

31 Claims, 12 Drawing Sheets

(56) References Cited

U.S. PATENT DOCUMENTS

| | | | |
|---|---|---|---|
| 8,110,991 B2 | 2/2012 | Coumou | |
| 8,395,322 B2 | 3/2013 | Coumou | |
| 8,416,008 B2 | 4/2013 | Van Zyl et al. | |
| 9,320,126 B2 * | 4/2016 | Valcore, Jr. | H01J 37/32183 |
| 9,496,122 B1 | 11/2016 | Bhutta | |
| 9,673,027 B2 * | 6/2017 | Yamamoto | H01L 22/14 |
| 9,755,576 B2 | 9/2017 | Perreault et al. | |
| 9,876,476 B2 | 1/2018 | Coumou et al. | |
| 10,049,857 B2 | 8/2018 | Fisk, II et al. | |
| 10,270,418 B2 | 4/2019 | Kim et al. | |
| 10,546,724 B2 | 1/2020 | Radomski et al. | |
| 10,821,542 B2 | 11/2020 | Nelson et al. | |
| 11,107,661 B2 | 8/2021 | Oliveti et al. | |
| 2004/0027209 A1 | 2/2004 | Chen et al. | |
| 2009/0167457 A1 | 7/2009 | Melde et al. | |
| 2015/0349750 A1 * | 12/2015 | Van Zyl | H03H 7/38 |
| | | | 315/111.21 |
| 2017/0345620 A1 | 11/2017 | Coumou et al. | |
| 2020/0144032 A1 * | 5/2020 | Ulrich | H01L 21/67069 |
| 2020/0150164 A1 * | 5/2020 | Ulrich | G01R 25/04 |
| 2020/0168439 A1 * | 5/2020 | Bhutta | H01J 37/32183 |
| 2021/0013009 A1 | 1/2021 | Oliveti et al. | |

FOREIGN PATENT DOCUMENTS

| | | | |
|---|---|---|---|
| JP | 2017050859 | | 3/2017 |
| JP | 2018504864 | | 11/2017 |
| JP | 2019525508 | | 11/2017 |
| KR | 10-2020-0012992 | A | 2/2020 |
| TW | 201742516 | A | 12/2017 |
| WO | WO-2017204889 | A1 | 11/2017 |
| WO | WO-2021152812 | A1 | 8/2021 |

OTHER PUBLICATIONS

International Search Report and Written Opinion regarding International Patent Application No. PCT/US2022/039502, dated Nov. 21, 2022.

International Preliminary Report on Patentability and Written Opinion of the ISA issued in PCT/US2022/039502, mailed Feb. 13, 2024; ISA/US.

Taiwanese Office Action regarding Patent Application No. 111130175, dated Aug. 2, 2023.

Japanese Office Action regarding Patent Application No. 2024504842, dated Feb. 12, 2025.

Korean Office Action regarding Patent Application No. 1020247003198.

Extended European Search Report received for related EP Application No. 22856443 dated Apr. 28, 2025.

Taiwanese Office Action regarding Patent Application No. 111130175, dated Apr. 28, 2025.

Notice of Allowance issued in KR counterpart application No. 10-2024-7003198 dated Oct. 23, 2025 (6 pages).

* cited by examiner

RF In

RF In

HYBRID HIGH-POWER AND BROADBAND VARIABLE IMPEDANCE MODULES

CROSS-REFERENCE TO RELATED APPLICATIONS

This application claims the benefit of U.S. Provisional Application No. 63/231,861, filed on Aug. 11, 2021. The entire disclosure of the above application is incorporated herein by reference.

FIELD

The present disclosure relates to impedance modules and to control of impedance modules.

BACKGROUND

Plasma processing is frequently used in semiconductor fabrication. In plasma processing, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

In some examples, the power delivery system includes a matching network positioned between the generator and the plasma load. The matching network may reduce an impedance mismatch between the generator and the plasma load. The matching network may include a vacuum variable capacitor (VVC) that is mechanically actuated to change its capacitance, or a solid state, electronically variable capacitor.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. According to one aspect of the present disclosure, a power supply system includes a RF generator, a matching network, and a control module. The RF generator includes a RF power source configured to output a RF signal. The matching network is coupled between the RF generator and a load. The matching network includes at least one mechanically variable impedance element and at least one electrically variable impedance element. The control module is coupled to the matching network and configured to generate one or more signals to adjust at least one of an impedance of the mechanically variable impedance element or an impedance of the electrically variable impedance element to vary an impedance match between an input side of the matching network and the load. Other embodiments of this aspect include corresponding computer systems, apparatus, and computer programs recorded on one or more computer storage devices, each configured to perform the actions of the methods.

Implementations may include one or more of the following features. The power supply system where the at least one mechanically variable impedance element includes at least one of a capacitive component or an inductive component, and where the at least one electrically variable impedance element includes at least one of an inductive component or a capacitive component. The at least one electrically variable impedance element includes a switching device, and where the control module is configured to generate at least one of the signals for the switching device to adjust the impedance of the electrically variable impedance element. The at least one electrically variable impedance element includes one or more varactors, and where the control module is configured to adjust an impedance of the one or more varactors based on a bias voltage. The matching network includes at least one of a capacitive component or an inductive component coupled to at least one of the mechanically variable impedance element or the electrically variable impedance element. The control module is configured to adjust an impedance of the capacitive component or the inductive component by varying a frequency of the RF signal. The at least one mechanically variable impedance element and the at least one electrically variable impedance element are coupled in parallel. The at least one mechanically variable impedance element and the at least one electrically variable impedance element are coupled in series. The at least one mechanically variable impedance element is a first mechanically variable impedance element and the at least one electrically variable impedance element is a first electrically variable impedance element, where the matching network includes a second mechanically variable impedance element and a second electrically variable impedance element, and where the control module is configured to generate one or more signals to adjust at least one of an impedance of the second mechanically variable impedance element or an impedance of the second electrically variable impedance element. Implementations of the described techniques may include hardware, a method or process, or computer software on a computer-accessible medium.

According to another aspect of the present disclosure, a hybrid variable impedance module includes at least one mechanically variable impedance element, at least one electrically variable impedance element, and a control module coupled to at least one of the mechanically variable impedance element or the electrically variable impedance element. The control module is configured to generate one or more signals to adjust at least one of an impedance of the mechanically variable impedance element or an impedance of the electrically variable impedance element. Implementations of the described techniques may include hardware, a method or process, or computer software on a computer-accessible medium.

Implementations may include one or more of the following features. The hybrid variable impedance module Where the at least one mechanically variable impedance element and the at least one electrically variable impedance element are coupled in parallel. The at least one mechanically variable impedance element and the at least one electrically variable impedance element are coupled in series. The at least one mechanically variable impedance element includes at least one of a capacitive component or an inductive component. The at least one electrically variable impedance element includes at least one of an inductive component, a capacitive component, or a varactor. The at least one electrically variable impedance element includes a switching device, and where the control module is configured to generate at least one of the signals for the switching device to adjust the impedance of the at least one electrically variable impedance element. The hybrid variable impedance module may include at least one of a capacitive component or an inductive component coupled to at least one of the mechanically variable impedance element or the electrically variable impedance element. The matching network is configured to couple between a rf power source and a load. The matching network may include at least one of a capacitive component or an inductive component coupled to at least one of the mechanically variable impedance element or the electrically variable impedance element. The matching network is configured to receive an rf signal from the rf power source, and where the control module is configured to adjust an impedance of the capacitive component or the inductive component by varying a frequency of the rf signal. The hybrid variable impedance module is a first hybrid variable impedance module, where the matching network further may include a second hybrid variable impedance module coupled to the first hybrid variable impedance module, and where the second hybrid variable impedance module includes at least one mechanically variable impedance element and at least one electrically variable impedance element. Implementations of the described techniques may include hardware, a method or process, or computer software on a computer-accessible medium.

According to another aspect of the present of the present disclosure, a non-transitory computer-readable medium storing instructions is provided. The instructions include receiving, at a matching network, a RF signal from a RF power source. The matching network includes at least one mechanically variable impedance element and at least one electrically variable impedance element. The instructions further include, in response to receiving the RF signal, determining whether an impedance match is present between an input side of the matching network and a load coupled to the matching network, and if the impedance match is not present, adjusting an impedance of the matching network to achieve the impedance match by changing at least one of an impedance of the at least one mechanically variable impedance element or an impedance of the at least one electrically variable impedance element.

Implementations may include one or more of the following features. The non-transitory computer-readable medium storing instructions the instructions may include calculating a change in impedance of the matching network to achieve the impedance match. The non-transitory computer-readable medium storing instructions the instructions may include determining if the change in impedance of the matching network to achieve the impedance match is within an operable range of the at least one electrically variable impedance element. Adjusting the impedance of the matching network to achieve the impedance match includes only changing the impedance of the at least one electrically variable impedance element, in response to determining the change in impedance of the matching network to achieve the impedance match is within the operable range of the at least one electrically variable impedance element. Adjusting the impedance of the matching network to achieve the impedance match includes changing the impedance of the at least one mechanically variable impedance element and the impedance of the at least one electrically variable impedance element, in response to determining the change in impedance of the matching network to achieve the impedance match is outside the operable range of the at least one electrically variable impedance element. The non-transitory computer-readable medium storing instructions the instructions may include, if the impedance match is present, changing the impedance of the at least one electrically variable impedance element so that the at least one electrically variable impedance element is operating at an optimized position within an operable range of the at least one electrically variable impedance element. The non-transitory computer-readable medium storing instructions the instructions may include, if the impedance match is present, changing the impedance of the at least one mechanically variable impedance element so that the at least one mechanically variable impedance element is operating at an optimized position within an operable range of the at least one mechanically variable impedance element. The non-transitory computer-readable medium storing instructions the instructions may include, if the impedance match is present, changing the impedance of the at least one electrically variable impedance element so that the at least one electrically variable impedance element is operating at an optimized position within an operable range of the at least one electrically variable impedance element. The at least one electrically variable impedance element includes a switching device and where changing the impedance of the at least one electrically variable impedance element includes controlling the switching device of the at least one electrically variable impedance element to change the impedance of the electrically variable impedance element. The at least one electrically variable impedance element includes one or more varactors and where changing the impedance of the at least one electrically variable impedance element includes adjusting a bias voltage applied to the one or more varactors to change the impedance of the electrically variable impedance element. The matching network includes at least one of a capacitive component or an inductive component coupled to at least one of the mechanically variable impedance element or the electrically variable impedance element. Adjusting the impedance of the matching network includes varying a frequency of the rf signal to adjust an impedance of the capacitive component or the inductive component. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
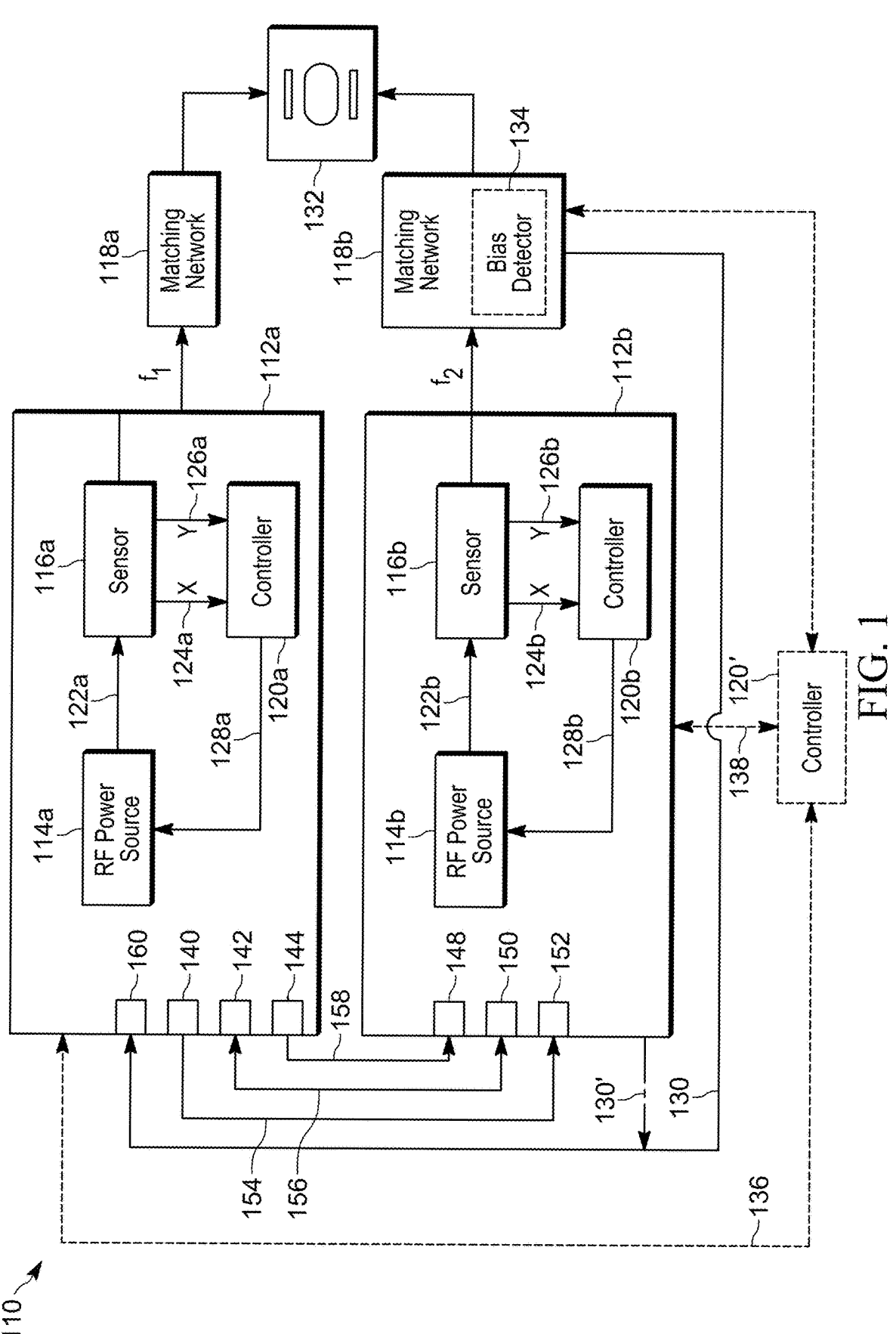
FIG. 1 is a schematic diagram of a power delivery system having multiple power supplies arranged according to various embodiments of the present disclosure.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit transforms a load impedance of the matching network to a characteristic impedance of a transmission line between the power generator and the matching network. The impedance matching aids in maximizing an amount of power forwarded to the load ("forward power") and minimizing an amount of power reflected back from the load to the power generator ("reverse power" or "reflected power"). The net power delivered to the plasma is called "delivered power," and is calculated as delivered power=forward power−reflected power. Forward and delivered power may be maximized and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by amplitude, frequency and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (MD) emissions from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

Conventional methods to improve stability of plasma loads under RF pulsed plasma processes rely on a RF generator to output a significantly higher power than commanded during a short time at the start of every pulse. Other conventional methods rely on a tradeoff between improved power delivery at the start of the pulse and higher reflected power during a steady-state portion of the pulse. This is typically accomplished by positioning a match or matching network (also referred to herein as a match or matching circuit) to improve the impedance match between the RF generator and a load at the start of the pulse. In such scenarios, the matching network typically includes one or more vacuum variable capacitors (VVCs), which may be capable of handling high power levels such as, for example, up to tens of kW or more. By doing so, the impedance match may not be optimal during the steady part of the pulse, and thus an increase in reflected power may be present. Recently, significant development has gone into solid state, electronically variable capacitor (eVC) based impedance matching networks. Pulsing applications have benefited from improved pulse-to-pulse stability due to the fast-tuning speed of these matching networks, but due to the nature of eVCs, the power handling capabilities is limited for many industrial and semiconductor applications. For example, traditional eVC-based matching networks are limited to lower power operation (e.g., typically less than 3.0 kW).

Depending on the mismatch between the RF generator and the load at the start of a pulse or at a plasma ignition event, the required power from the RF generator may be outside of its capability. This may result in the RF generator operating over its steady-state limits, leading to higher generator failure rates, narrower process windows, and process dependent matching network positioning. In the case of optimizing the matching network positions to minimize mismatch at start of pulse, each process or process step would need to be characterized to obtain the optimal positions. This can be laborious as changes in a process or system condition may cause a re-characterization. With solid state-based matching networks, issues such as control loop interactions and limited power handling capabilities can lead to many integration and process window issues.

As such, there is a desire to have a matching network that can quickly tune and handle the high-power levels typically encountered in today's processing equipment. The inventors recognized that a hybrid tuning module which can be used in place of traditional eVC or WC tuning elements in a matching network, may improve the performance and operating window of the matching network and overall system. As should be apparent, however, the hybrid tuning module is not limited to use within matching networks, as its use can be extended to any situation that demands a high-power, high-speed variable impedance device.

In various embodiments, the hybrid tuning module may be a hybrid variable impedance module (hVIM) with extended power handling capability and high-speed impedance control. The hVIM includes at least one mechanically variable impedance element (mVIE) and at least one electrically variable impedance element (eVIE). During operation, control determines the impedance setpoints of the mVIE and eVIE to achieve a desired overall hVIM impedance.

mVIEs such as WCs, variable inductors (VI), etc. have high power handling capability, wide RF range, and proven reliability in the RF matching network industry. However, the response of mVIEs to impedance setpoint changes may be slow. The limited setpoint bandwidth of mVIEs arises from the nature of its mechanically controlled/actuated impedance. On the other hand, eVIEs such as eVCs have no moving components, and are actuated based on electrical signals, Such electrical signals provide for faster actuation as compared to mechanical actuation. As such, eVIEs may quickly respond to impedance setpoint changes. However, in some cases, eVIEs may have limited voltage and/or current handling capability when compared to mVIEs.

The hVIMs, with their complementary impedance elements, described herein provide the higher power operation afforded by mVIEs and the fast response afforded by eVIEs. For example, an impedance mismatch may be at its greatest during a plasma ignition event or at a start of a pulse, as impedances of the load and/or the RF generator may rapidly change. When such events occur, an eVIE and a mVIE of a hVIM may both adjust to change their impedances. In such scenarios, the eVIE is able to respond to the impedance change quicker than the mVIE. As such, if the eVIE is able to handle the power requirements, the eVIE may contribute a portion of the hVIM impedance. Once the slower responding mVIE is able to ramp up to a steady state, the mVIE may contribute a large portion of the hVIM impedance while the eVIE may provide the balance.

In various embodiments, impedance mismatches may also occur during state-to-state changes within a pulse. When such events occur, the eVIE may be adjusted to quickly respond to such changes in impedance. During this time, the mVIE may be operating at its steady state, and contributing a large portion of the hVIM impedance while the eVIE may provide the balance.

In various embodiments, control of the mVIE and eVIE may employ numerous operating modes. For example, in one operating mode, a controller can enable mostly symmetric impedance range of operation of the eVIE about an operating point determined by the mVIE. In another operating mode, the range of operation of the eVIE may be skewed to either side of operating point determined by the mVIE, such as to accommodate fast asymmetric impedance variations. As such, the controller may adjust the mVIE to a desired operating point, and then quickly adjust the eVIE as necessary to fine tune the hVIM impedance.

FIG. 1 depicts a power supply system no. Power supply system 110 includes a pair of RF generators 112a, 112b, also referred to as power supplies, matching networks 118a, 118b, and a load 132, such as a non-linear load, which may be a plasma chamber, process chamber, and the like. In various embodiments, RF generator 112a is referred to as a source RF generator or power supply, and matching network 118a is referred to as a source matching network. Also in various embodiments, RF generator 112b is referred to as a bias RF generator or power supply, and matching network 118b is referred to as a bias matching network. It will be understood that the components can be referenced individually or collectively using the reference number without a letter subscript or a prime symbol.

In various embodiments, source RF generator 112a receives a control signal 130 from matching network 118b, generator 112b, or a control signal 130' from bias RF generator 112b. As will be explained in greater detail, control signal 130 or 130' represents an input signal to source RF generator 112a that indicates one or more operating characteristics or parameters of bias RF generator 112b. In various embodiments, a synchronization bias detector 134 senses the RF signal output from matching network 118b to load 132 and outputs a synchronization or trigger signal 130 to source RF generator 112a. In various embodiments, synchronization or trigger signal 130' may be output from bias RF generator 112b to source RF generator 112a, rather than trigger signal 130. A difference between trigger or synchronization signals 130, 130' may result from the effect of matching network 118b, which can adjust the phase between the input signal to and output signal from matching network. Signals 130, 130' include information about the operation of bias RF generator 112b that in various embodiments enables predictive responsiveness to address periodic fluctuations in the impedance of load 132 caused by the bias RF generator 112b. When control signals 130 or 130' are absent, RF generators 112a, 112b operate autonomously.

RF generators 112a, 112b include respective RF power sources or amplifiers 114a, 114b, RF sensors 116a, 116b, and processors, controllers, or control modules 120a, 120b. RF power sources 114a, 114b generate respective RF power signals 122a, 122b output to respective sensors 116a, 116b. Sensors 116a, 116b receive the output of RF power sources 114a, 114b and generate respective RF output signals or RF power signals $f_1$ and $f_2$. Sensors 116a, 116b also output signals that vary in accordance with various parameters sensed from load 132. While sensors 116a, 116b, are shown within respective RF generators 112a, 112b, RF sensors 116a, 116b can be located externally to the RF power generators 112a, 112b. Such external sensing can occur at the output of the RF generator, at the input of an impedance matching device located between the RF generator and the load, or between the output of the impedance matching device (including within the impedance matching device) and the load.

Sensors 116a, 116b detect various operating parameters and Output signals X and Y. Sensors 116a, 116b may include voltage, current, and/or directional coupler sensors. Sensors 116a, 116b may detect (i) voltage V and current I and/or (ii) forward power $P_{FWD}$ output from respective power amplifiers 114a, 114b and/or RF generators 112a, 112b and reverse or reflected power $P_{REV}$ received from respective matching network 118a, 118b or load 132 connected to respective sensors 116a, 116b, The voltage V, current I, forward power $P_{FWD}$, and reverse power $P_{REV}$ may be scaled, filtered, or scaled and filtered versions of the actual voltage, current, forward power, and reverse power associated with the respective power sources 114a, 114b. Sensors 116a, 116b may be analog or digital sensors or a combination thereof. In a digital implementation, the sensors 116a, 116b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 116a, 116b generate sensor signals X, Y, which are received by respective controllers or power control modules 120a, 120h. Power control modules 120a, 120b process the respective X, Y signals 124a, 126a and 124b, 126b and generate one or a plurality of feedforward or feedback control signals 128a, 128b to respective power sources 114a, 114b. Power sources 114a, 114b adjust the RF power signals 122a, 122b based on the received one or plurality feedback or feedforward control signal. In various embodiments, power control modules 120a, 120b may control matching networks 118a, 118b, respectively, via respective control signals. Power control modules 120a, 120b may include, at least, proportional integral derivative (PID) controllers or subsets thereof and/or direct digital synthesis (DDS) component(s) and/or any of the various components described below in connection with the modules.

In various embodiments, power control modules 120a, 120b are PID controllers or subsets thereof and may include functions, processes, processors, or submodules. Control signals 128a, 128b may be drive signals and may include DC offset or rail voltage, voltage or current magnitude, frequency, and phase components. In various embodiments, feedback control signals 128a, 128b can be used as inputs to one or multiple control loops. In various embodiments, the multiple control loops can include a proportional-integral-derivative (PID) control loop for RF drive, and for rail voltage. In various embodiments, control signals 128a, 128h can be used in a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other embodiments, signals 128a, 128b can provide feedforward control as described in U.S. Pat. No. 10,049,857, assigned to the assignee of the present application and incorporated by reference herein.

In various embodiments, power supply system 110 can include controller 120', also referred to a processor or a control module. Controller 120' may be disposed externally to either or both of RF generators 112a, 112b and may be referred to as external or common controller 120'. In various embodiments, controller 120' may implement one or a plurality of functions, processes, or algorithms described herein with respect to one or both of controllers 120a, 120b. Accordingly, controller 120' communicates with respective RF generators 112a, 112b via a pair of respective links 136, 138 which enable exchange of data and control signals, as appropriate, between controller 120' and RF generators 112a, 112b. For the various embodiments, controllers 120a, 120b, 120' can distributively and cooperatively provide analysis and control along with RF generators 112a, 112b. In various other embodiments, controller 120' can provide control of RF generators 112a, 112b, eliminating the need for the respective local controllers 120a, 120b.

In various embodiments, RF power source 114a, sensor 116a, controller 120a, and matching network 118a can be referred to as source RF power source 114a, source sensor 116a, source controller 120a, and source matching network 118a. Similarly in various embodiments, RF power source 114b, sensor 116b, controller 120b, and matching network 118b can be referred to as bias RF power source 114b, bias sensor 116b, bias controller 120b, and bias matching network 118b, In various embodiments and as described above, the source term refers to the RF generator that generates a plasma, and the bias term refers to the RF generator that tunes the plasma Ion Energy Distribution Function (IEDF). In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

According to various embodiments, source RF generator 112a and bias RF generator 112b include multiple ports to communicate externally. Source RF generator 112a includes a pulse synchronization output port 140, a digital communication port 142, a RF output port 144, and a control signal port 160. Bias RF generator 112b includes a RF input port 148, a digital communication port 150, and a pulse synchronization input port 152, Pulse synchronization output port 140 outputs a pulse synchronization signal 154 to pulse synchronization input port 152 of bias RF generator 112b. Digital communication port 142 of source RF generator 112a and digital communication port 150 of bias RF generator 112h communicate via a digital communication link 156. Control signal port 160 of source RF generator 112a receives control signal 130 and/or 130'. RF output port 144 generates a RF control signal 158 input to RF input port 148. In various embodiments, RF control signal 158 is substantially the same as the RF control signal controlling source RF generator 112a. In various other embodiments, RF control signal 158 is the same as the RF control signal controlling source RF generator 112a, but is phase shifted within source RF generator 112a in accordance with a requested phase shift generated by bias RF generator 112b. Thus, in various embodiments, source RF generator 112a and bias RF generator 112b are driven by substantially identical RF control signals or by substantially identical RF control signal phase shifted by a predetermined amount.

Figure 2:
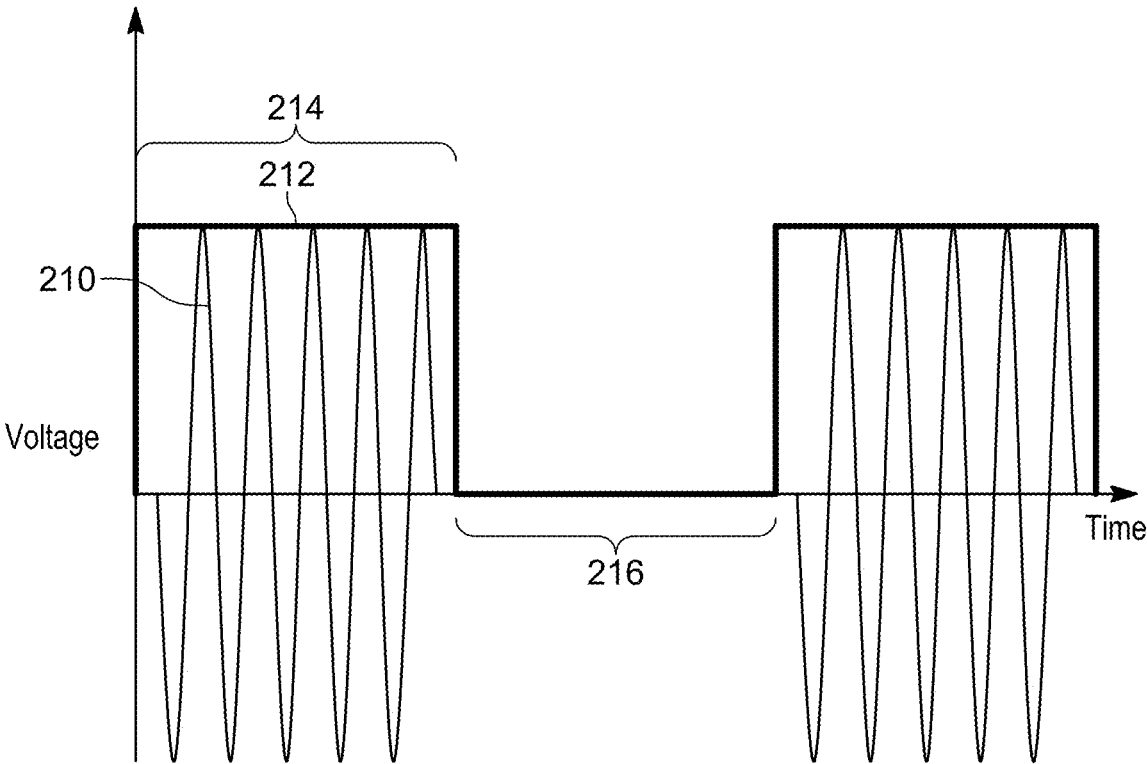
FIG. 2 shows waveforms of a RF signal and a pulse modulating the RF signal.

FIG. 2 depicts a plot of voltage versus time to describe a pulse mode of operation for delivering power to a load, such as load 132 of FIG. 1. In FIG. 2, RF signal 210 is modulated by pulse 212. As shown at period or region 214 of pulse 212, when pulse 212 is ON, RF generator 112 outputs RF signal 210. Conversely, during period or region 216 of pulse 212, pulse 212 is OFF, and RF generator 112 does not output RF signal 210. Pulse signal 212 can repeat at a constant duty cycle or a variable duty cycle. Further, pulse signal 212 need not be embodied as a square wave as shown in FIG. 2. Further yet, pulse 212 can have multiple ON and OFF regions of varying amplitude and duration. The multiple regions may repeat within a fixed or variable period.

FIGS. 3-7 depict various embodiments of hybrid variable impedance modules (hVIMs) for matching circuits such as the matching circuits 118a, 118b of FIG. 1. Each hVIM may be referred to herein as a module or a hybrid variable impedance circuit. As shown in FIGS. 3-7, each hVIM or module includes a mVIE and an eVIE. Although each module of FIGS. 3-7 is shown as including one mVIE and one eVIE, it should be apparent that any one of the modules may include two or more mVIEs and/or two or more eVIEs to achieve a desired variable impedance range of the module.

Additionally, in various embodiments, each module of FIGS. 3-7 may include one or more fixed circuit components in addition to mVIE and eVIE. This may assist in achieving a desired variable impedance range of the module. Such fixed circuit components may include, for example, one or more fixed impedance components such as capacitive components and/or inductive components.

In FIGS. 3-7, mVIE and mVIE are shown as including one or more capacitive components. For example, each mVIE may include a VVC as shown in FIGS. 3-7. Although each mVIE is shown as including only one VCC, it should be apparent that multiple VVCs and/or another suitable variable impedance component that is mechanically actuated to change its impedance may be employed if desired.

Additionally, each eVIE may include an eVC as shown in FIGS. 3-7, or another suitable variable impedance component that is electrically actuated to change its impedance, Various example eVIE architectures are shown in FIGS. 3-7. For example, each eVIE may include one or more switched capacitors, capacitors that implement phased-switched impedance modulation (PSIM), varactors, or any combination thereof. As such, eVIE architectures may include a combination of one or more capacitors and one or more switching devices, such as transistors (e.g., FETs, IGBTs, BJTs, etc.), diodes (e.g., PIN diodes, etc.), etc. Although each eVIE is shown as including a specific number of capacitors and/or switching devices, it should be apparent that more or less capacitors and/or switching devices may be employed if desired.

In various embodiments, switching devices can function as ON/OFF switches to connect or disconnect capacitors (e.g., fixed capacitors) to the rest of the module. In embodiments where PSIM is employed, a switching device may be connected in parallel with a fixed capacitor and the effective capacitance is controlled by switching ON/OFF every RF cycle. In such embodiments, the effective capacitance of the eVIE may be controlled by the duty cycle of the parallel, switching device during the RF cycle.

In various embodiments, any one of the mVIEs and/or eVIEs of FIGS. 3-7 may include one or more variable inductive components that are mechanically or electrically actuated to change their inductance (and impedance).

As shown in FIGS. 3-7, each module (WM) or circuit is coupled between a RF input and a RF output or ground (or another suitable reference). RF input, RF output, and ground are shown as RF IN, RF OUT, GND, respectively, in FIGS. 3-7. In such examples, RF input may represent a RF output signal (or a RF power signal) received from a RF generator, such as the RF generator 112a or 112b of FIG. 1. Additionally, RF output may represent a RF output signal (or a RF power signal) provided to a load, such as load 132 of FIG. 1. In various embodiments, each module may be a portion of a (or the entire) circuit representing a series leg coupled between RF input and RF output. In other embodiments, each module may be a portion of a (or the entire) circuit representing a shunt or load leg coupled between RF input and ground.

Figure 3:
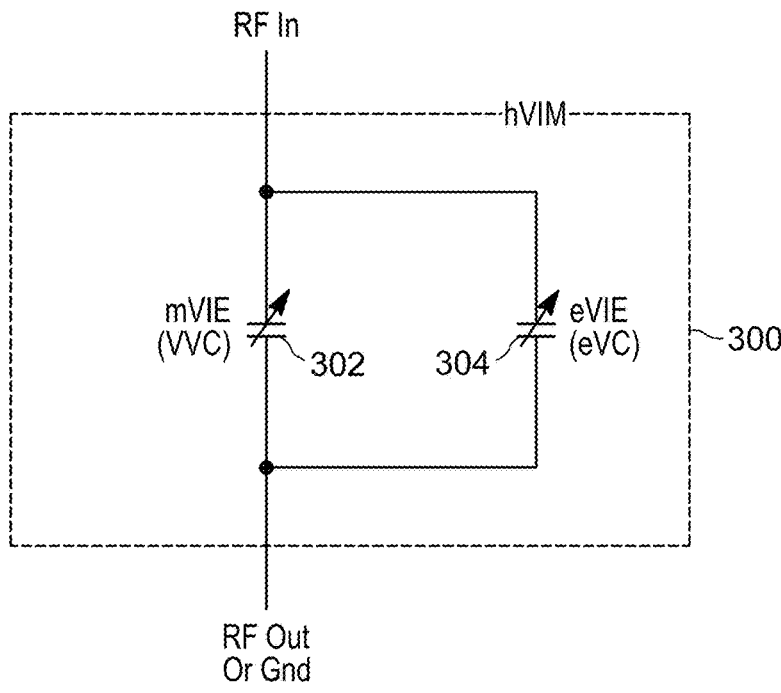
FIG. 3 is a schematic diagram of a hybrid variable impedance module (hVIM) having a mechanically variable impedance element (mVIE) and an electrically variable impedance element (eVIE) coupled in parallel according to various embodiments of the present disclosure.

For example, FIG. 3 depicts a module 300 including a mVIE 302 and an eVIE 304. As shown, mVIE 302 and eVIE 304 are coupled in parallel. For example, input sides of mVIE 302 and eVIE 304 are coupled together, and output sides of mVIE 302 and eVIE 304 are coupled together. Input sides of mVIE 302 and eVIE 304 are coupled (e.g., directly or indirectly via one or more components) to RF input, and output sides of mVIE 302 and eVIE 304 are coupled (e.g., directly or indirectly via one or more components) to RF output or ground.

In the example of FIG. 3, mVIE 302 and/or eVIE 304 may be controlled such that an impedance of mVIE 302 and/or an impedance of eVIE 304 are adjusted, as explained herein. As a result, a mismatch between an impedance on an input side of the matching network and the impedance of the load may be decreased (and sometimes minimized or eliminated).

Figure 4:
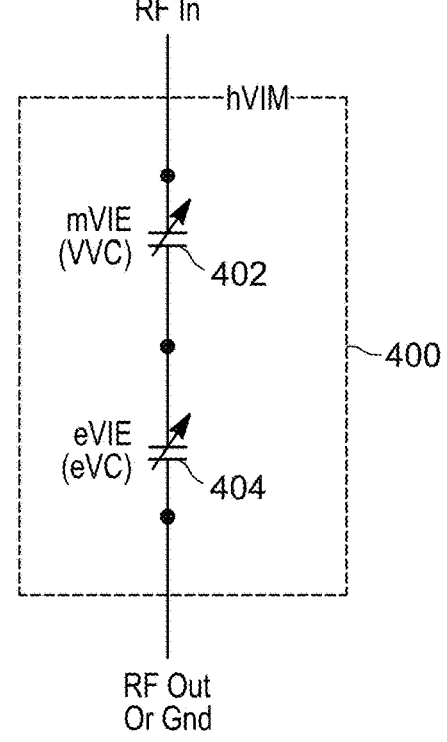
FIG. 4 is a schematic diagram of a hVIM having a mVIE and an eVIE coupled in series according to various embodiments of the present disclosure.

FIG. 4 depicts a module 400 including a mVIE 402 and an eVIE 404. As shown, mVIE 402 and eVIE 404 are coupled in series. For example, an input side of mVIE 402 is coupled (directly or indirectly) to RF input, an output side of mVIE 402 is coupled (directly or indirectly) to an input side of eVIE 404, and an output side of eVIE 404 is coupled (directly or indirectly) to RF output or ground.

In the example FIG. 4, mVIE 402 and/or eVIE 404 may be controlled in a similar manner as mVIE 302 and/or eVIE 304 of FIG. 3. For example, and as explained herein, mVIE 402 and/or eVIE 404 may be controlled to cause an impedance of mVIE 302 and/or an impedance of eVIE 304 to adjust as desired to decrease and sometimes minimize or eliminate) a mismatch between an impedance on an input side of the matching network and the impedance of the load.

Figure 5:
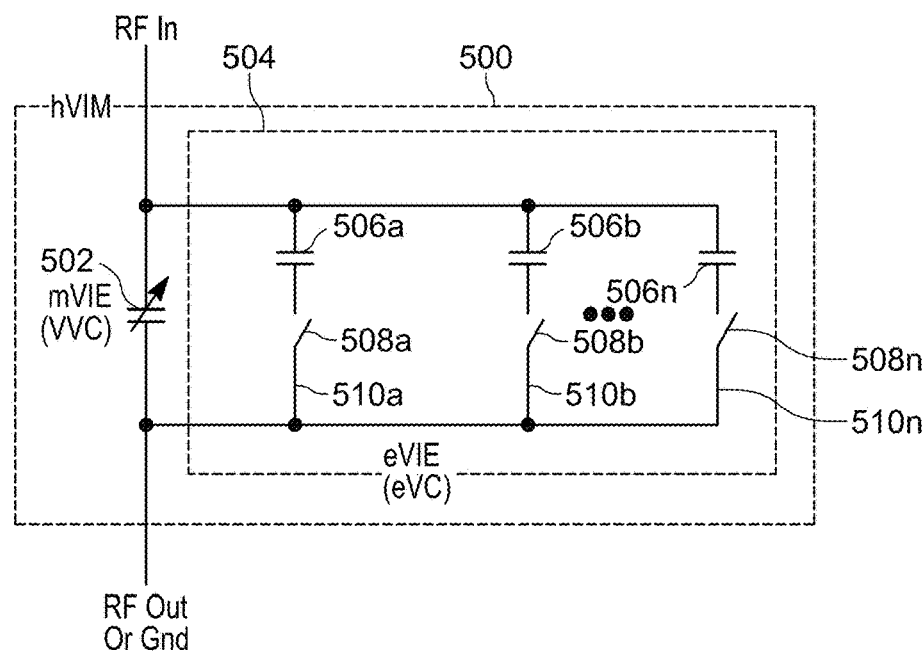
FIG. 5 is a schematic diagram of a hVIM including a mVIE and an eVIE having switching capacitors for making discrete capacitance adjustments according to various embodiments of the present disclosure.

FIG. 5 depicts a module 500 including a mVIE 502 and an eVIE 504 coupled in parallel. As shown, eVIE 504 includes multiple fixed capacitors 506a, 506b . . . 506n, and multiple switching devices 508a, 508b . . . 508n. Specifically, each fixed capacitor 506a, 506b . . . 506n is coupled in series to a respective switching device 508a, 508b . . . 508E to form a leg 510a, 510b . . . 510n of eVIE 504. As shown, legs 510a, 510b . . . 510n of eVIE 504 are coupled parallel.

In FIG. 5, mVIE 502 and/or eVIE 504 may be controlled in a similar manner as mVIE 302 and/or eVIE 304 of FIG. 3. For example, and as explained herein, mVIE 502 and/or eVIE 504 may be controlled to cause an impedance of mVIE 502 and/or an impedance of eVIE 504 to adjust as desired. For instance, each switching device 508a, 508b . . . 508n may be controlled to turn ON or OFF to connect or disconnect its respective fixed capacitor and provide a discrete capacitance. As a result, the impedance of eVIE 504 may change as switching devices 508a, 508b . . . 508n are turned ON (closed) or OFF (open), In such embodiments, capacitance of eVIE 504 may be considered a function of the number of switching devices 508a, 508b . . . 508n in their closed state.

Figure 6:
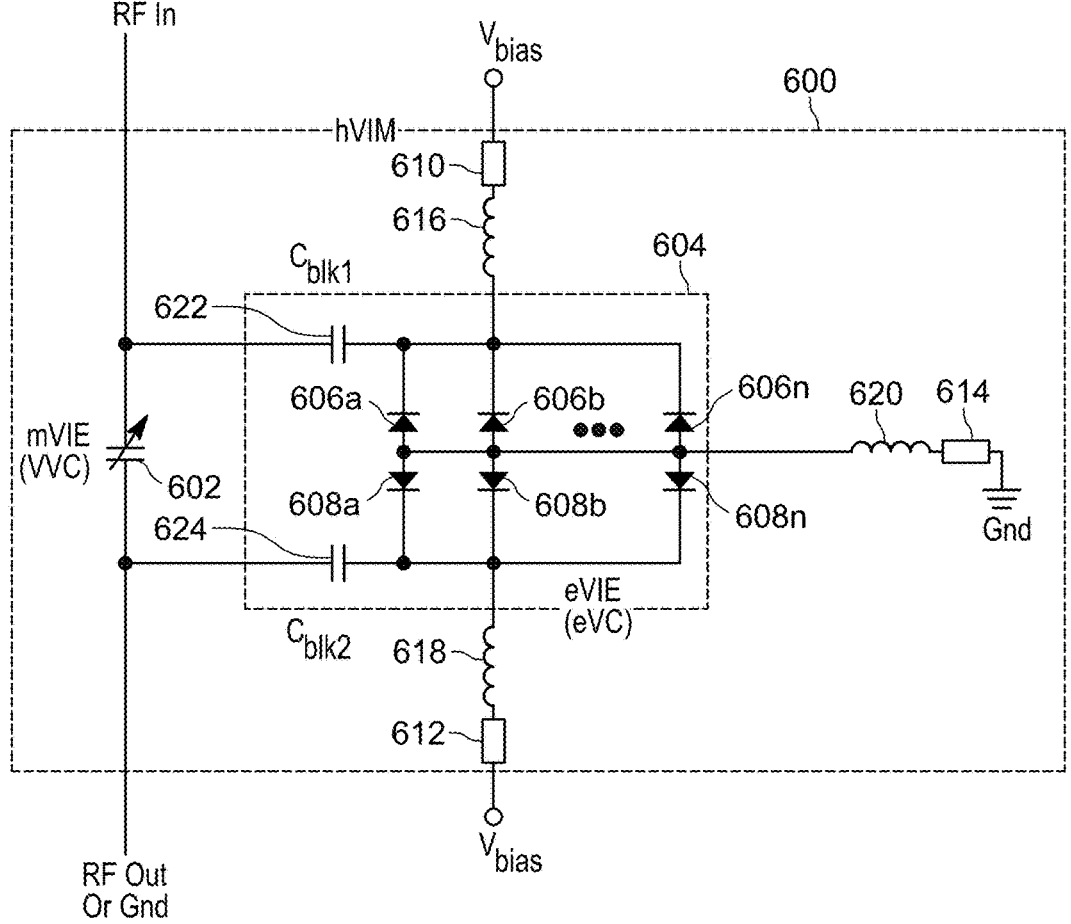
FIG. 6 is a schematic diagram of a hVIM including a mVIE and an eVIE having varactors for making continuous capacitance adjustments according to various embodiments of the present disclosure.

FIG. 6 depicts a module 600 including a mVIE 602 and an eVIE 604 coupled in parallel. As shown, eVIE 604 includes multiple varactors having a center-tapped bias. The varactors are represented by anode connected diodes (e.g., pin diodes) 606a, 608a, 606b, 608b . . . 606n, 608n, and capacitors (Cblk1, Cblk2) 622, 624 coupled to cathodes of the diodes 606a, 608a, 606b, 608b . . . 606n, 608n.

The varactors of FIG. 6 function as voltage-controlled capacitors. For example, the capacitance of each diode 606a, 608a, 606b, 608b . . . 606n . . . 608n may vary as a function of an applied voltage. Specifically, in FIG. 6, the capacitance of diodes 606a, 608a, 606b, 608b . . . 606n, 608n vary as a function of a bias voltage Vbias applied to diodes 606a, 608a, 606b, 608b . . . 606n, 608n via scaling resisters 610, 612, 614 and inductors 616, 618, 620. This may provide a continuous capacitance adjustment as bias voltage Vbias is applied and/or adjusted. In such embodiments, capacitance of eVIE 604 may be considered a function of bias voltage Vbias.

Although the varactors of FIG. 6 are shown as having a center-tapped bias configuration, it should be apparent that other suitable configurations may be employed. For example, eVIE 604 (or any other eVIE disclosed herein) may include one or more back-to-back varactors. In various embodiments, eVIE 604 may include a back-to-back diode varactor with anode connected diodes. In such examples, the back-to-back diode varactor may be represented by diodes, inductors, and at least one capacitor. The diodes and inductors may be connected in series between a DC bias voltage terminal and a reference terminal. (or ground). Anodes of the diodes are connected to each other. In other embodiments, eVIE 604 may include a back-to-back diode varactor with cathode connected diodes. This varactor configuration may be similar to back-to-back diode varactor with anode connected diodes, but where cathodes of the diodes are connected to each other.

Figure 7:
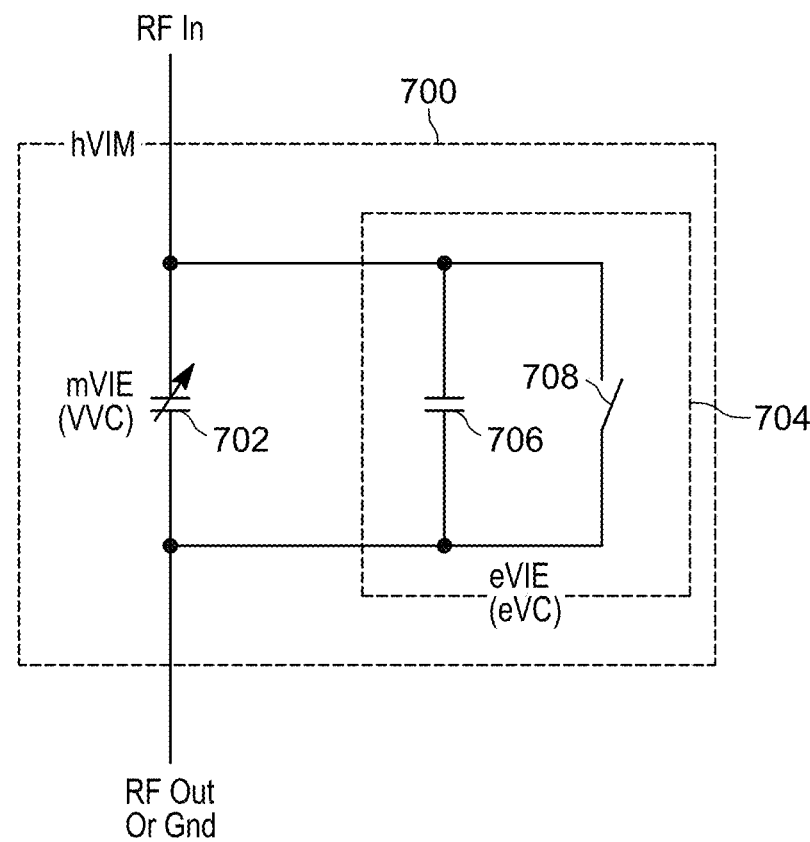
FIG. 7 is a schematic diagram of a hVIM including a mVIE and an eVIE having a switching capacitor employing phased-switched impedance modulation (PSIM) according to various embodiments of the present disclosure.

FIG. 7 depicts a module 700 including a mVIE 702 and an eVIE 704 coupled in parallel. As shown, eVIE 704 includes a capacitor 706 and a switching device 708.

Module 700 employs PSIM. For example, switching device 708 may be switched at a RF operating frequency, effectively modulating an impedance of capacitor 706. This modulation is controlled by appropriately adjusting the phase and duty cycle of switching device 708. As such, capacitance of eVIE 704 may be considered a function of a phase and duty cycle of switching device 708.

Figure 8:
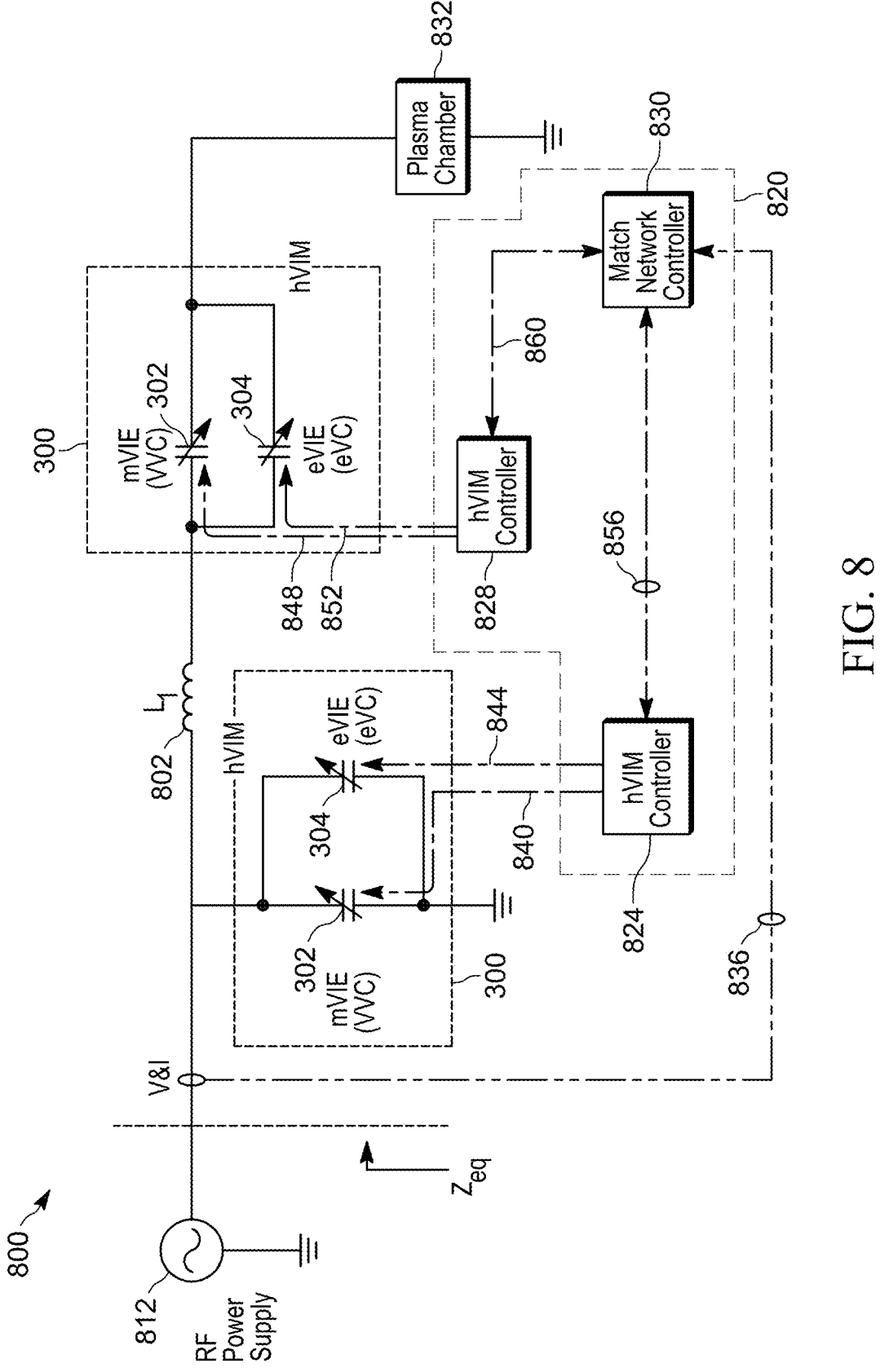
FIG. 8 is a schematic diagram of a power delivery system having a matching circuit with two hVIMs of FIG. 3 according to various embodiments of the present disclosure.
Figure 9:
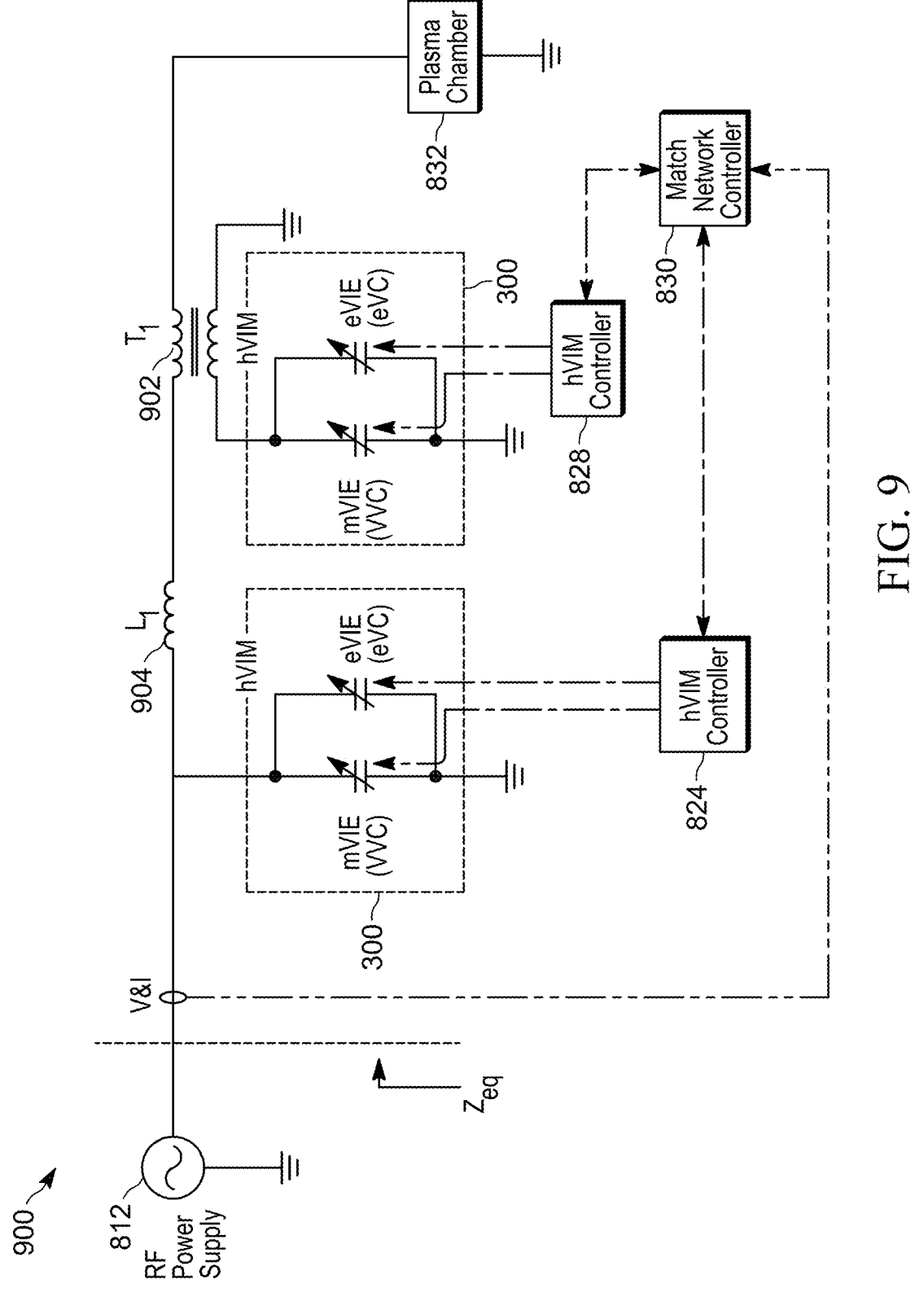
FIG. 9 is a schematic diagram of a power delivery system having a matching circuit with two hVIMs of FIG. 3 and a transformer according to various embodiments of the present disclosure.
Figure 10:
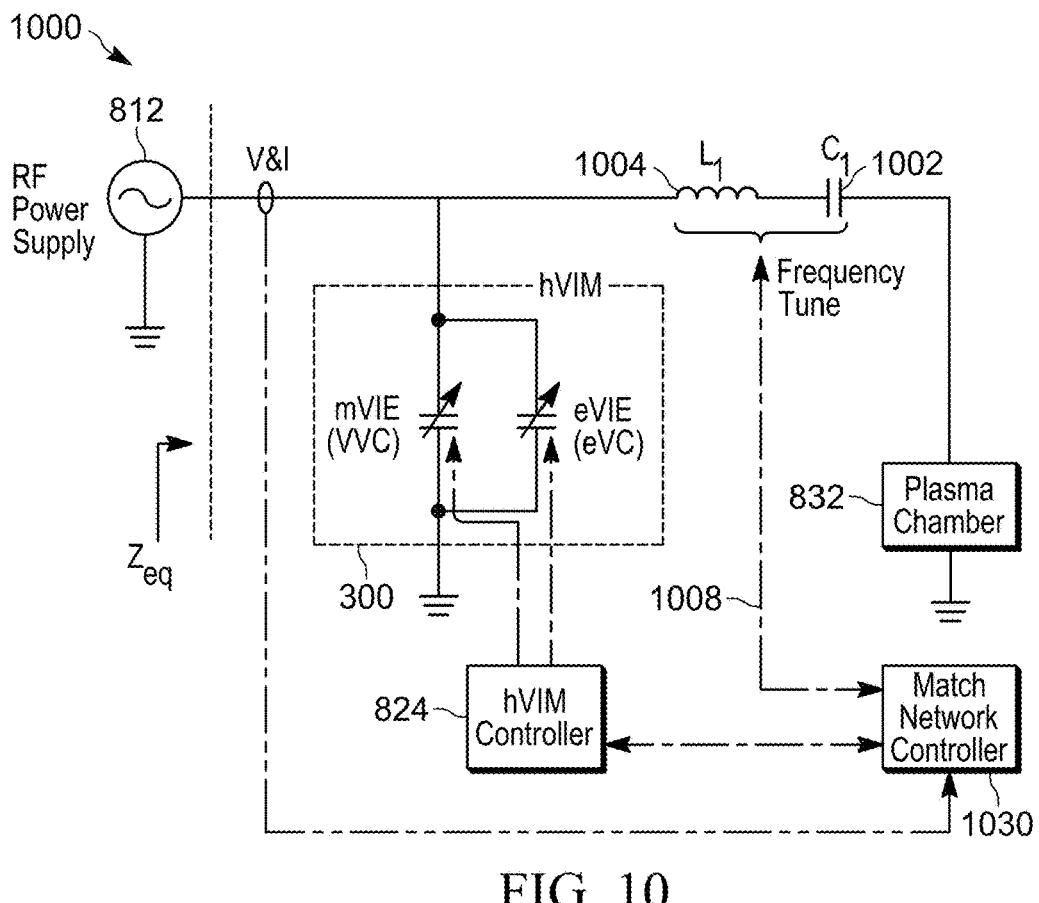
FIG. 10 is a schematic diagram of a power delivery system having a matching circuit implemented with a hVIM in conjunction with frequency tuning according to various embodiments of the present disclosure.

FIGS. 8-10 depict various embodiments of power supply systems. Each system generally includes a RF power supply 812, a matching circuit 800, 900, 1000, and a load 832. Each matching circuit 800, 900, 1000 utilizes hVIMs for its tunable components, as explained herein. In various embodiments, RF power supply 812 may be similar to RF generator 112*a* and/or 112*b* of FIG. 1. Although load 832 is shown as a plasma chamber in FIGS. 8-10, it should be apparent that other suitable loads (e.g., high power loads, linear or non-linear varying loads, etc.) may be employed.

In FIGS. 8-10, each hVIM may have a built-in or external controller. In various embodiments, each controller may be responsible for driving and/or establishing an impedance setpoint of tunable components (e.g., impedance variable elements) in the hVIM. An input to each hVIM controller may be a digital or analog representation of a desired impedance value, a digital or analog representation of a desired incremental impedance change, etc. This input may come from a matching network controller or another super-visory controller.

In FIG. 8, matching circuit 800 includes two hVIMs 300 of FIG. 3, an inductor (L1) 802 coupled between the hVIMs 300, and a control module 820. Each hVIM 300 includes mVIE 302 and eVIE 304 of FIG. 3. One (e.g., a first) hVIM 300 is coupled between a RF input (e.g., RF power supply 812) and ground, and the other (e.g., a second) hVIM 300 is coupled between RF input and a RF output (e.g., load 832).

As shown, control module 820 includes a matching net-work controller 830, and two hVIM controllers 824, 828 in communication with matching network controller 830. Matching network controller 830 receives one or more input signals 836 representing a sensed voltage, current, etc., and outputs signals 856, 860 to hVIM controllers 824, 828, respectively, based on the sensed voltage, current, etc. Outputs signals 856, 860 may be digital or analog represen-tations of desired impedance values, desired incremental impedance change, etc. hVIM controller 824 drives (via, e.g., signals 840, 844) and/or establishes impedance set-points for mVIE 302 and eVIE 304 in the first hVIM 300, and hVIM controller 828 drives (via, e.g., signals 848, 852) and/or establishes impedance setpoints for mVIE 302 and eVIE 304 in the second hVIM 300.

As shown in FIG. 8, matching network controller 830 and hVIM controllers 824, 828 are shown as being a part of control module 820. In various embodiments, hVIM con-trollers 824, 828 may be distributed controllers external to matching network controller 830. In other embodiments, hVIM controllers 824, 828 and matching network controller 830 may be combined into a single controller.

In FIG. 9, matching circuit 900 includes two hVIMs 300 of FIG. 3, an inductor (L1) 904, a transformer (T1) 902, and the controllers 824, 828, 830 of FIG. 8. Inductor (L1) 904 is coupled between the hVIMs 300, and transformer (T1) 902 is coupled between inductor (L1) 904 and load 832. As shown, a first hVIM 300 is coupled between a RF input (e.g., RF power supply 812) and ground, and a second hVIM 300 is coupled between RF input (via transformer (T1) 902) and ground. Controllers 824, 828, 830 function in a similar manner as explained above relative to FIG. 8.

Transformer (T1) 902 of FIG. 9 may serve many pur-poses. For example, transformer (T1) 902 effectively con-verts the second hVIM 300 from a series module (e.g., the second hVIM 300 of FIG. 8) to a shunt model. Additionally, transformer (T1) 902 provides isolation and reduces a volt-age applied to the second hVIM 300.

In FIG. 10, matching circuit 1000 includes hVIM 300 of FIG. 3, an inductor (L1) 1004, a capacitor (C1) 1002, hVIM controller 824 of FIG. 8, and a matching network controller 1030. hVIM 300 is coupled between a RF input (e.g, RF power supply 812 of FIG. 8) and ground. hVIM 300 (e.g., mVIE 302 and eVIE 304) may be controlled to adjust its impedance in a similar manner as explained above relative to FIG. 8.

Inductor (L1) 1004 and capacitor (C1) 1002 are coupled in series between RF input and a RF output (e.g., load 832). In various embodiments, the combination of inductor (L1) 1004 and capacitor (C1) 1002 may form an eVIE of a hVIM. In other embodiments, an eVIE may be coupled to inductor (L1) 1004 and capacitor (C1) 1002, and the combination of the eVIE, inductor (L1) 1004, and capacitor (C1) 1002 may form a hVIM.

In various embodiments, inductor 1004 and capacitor (C1) 1002 represent frequency tuning, in which the fre-quency of the RF signal output by RF power supply 812 varies to correspondingly vary the impedance match between RF power supply 812 and load 832. For example, in FIG. 10, inductor (L1) 1004 and capacitor (C1) 1002 may be an equivalent circuit representing the net effect of varying the frequency of the RF signal, as indicated by line 1008. As such, in various embodiments, varying the frequency of the RF signal may be equivalent of changing an inductive value of inductor (L1) 1004 and/or a capacitive value of capacitor (C1) 1002.

Additionally, matching network controller 1030 may indi-cate a desired frequency to a RF generator, such as RF generator 112*a* of FIG. 1 to effect frequency tuning in various embodiments. For example, matching network con-troller 1030 may generate control signals to vary the fre-quency of RF power supply 812. The desired frequency may be determined based on, for example, a sensed voltage, current, etc. at the input of matching circuit 1000.

In various embodiments, voltage and/or current feedback sensors may also be implemented for each eVIE, such as each eVIE shown in FIGS. 8-10. In such examples, hVIM controllers (e.g., hVIM controllers 824, 828 of FIGS. 8-10) may restrict a range of eVIE to within its safe operating area (SOA) during operation. In various embodiments, hVIM controllers and/or matching controllers (e.g., matching con-troller 830, 1030 of FIGS. 8-10) may use this sensed information to determine the best trade-off between power handling headroom and impedance range for a given appli-cation or operating mode.

Further, some of the hVIM configurations disclosed herein may be implemented as current and/or voltage shar-ing modules in various embodiments. For example, hVIM 300 of FIG. 3 may be implemented as a current sharing module and hVIM 400 of FIG. 4 may be implemented as a voltage sharing module. Specifically, as shown in FIG. 3, mVIE 302 and eVIE 304 are electrically coupled in parallel with each other. As such, current passing through hVIM 300 is shared or split between mVIE 302 and eVIE 304. In FIG. 4, mVIE 402 and eVIE 404 of hVIM 400 are electrically coupled in series with each other. Thus, in FIG. 4, voltage across hVIM 400 is shared or split between mVIE 402 and eVIE 404. The extent of sharing or splitting the current or voltage is determined by the relative impedance of the mVIE(s) and the eVIE(s) in the hVIM configuration. Such current and voltage splitting hVIM configurations may be desirable in very high-power continuous wave (CW) and quasi-CW applications. In such examples, an algorithm or user input may be employed to set impedances of the mVIE(s) and the eVIE(s) such that most of the current passes through or the voltage appears across the mVIE(s). As a result, the mVIE(s) handle most of the power flow shared between the mVIE(s) and the eVIE(s).

FIG. U depicts a plot of power load sharing between a mVIE and an eVIE of a hVIM, such as any one of the hVIMs shown in FIGS. 3-10. For example, the plot of FIG. 11 shows a power handling capability of each respective mVIE and eVIE.

For instance, in plasma applications where a load impedance varies with applied power, frequency, or other process conditions, the hVIM in the matching circuit may need to adjust to maintain optimal power delivery and system stability. In cases where the desired RF power changes between low and high-power states within a pulse, a controller (e.g., hVIM controller 824, matching controller 830, 1030, etc. of FIGS. 8-10) can be configured to control the mVIE and the eVIE such that the mVIE is handling most of the power flow while the eVIE is used to enable fast transitions between the various power states.

Figure 11:
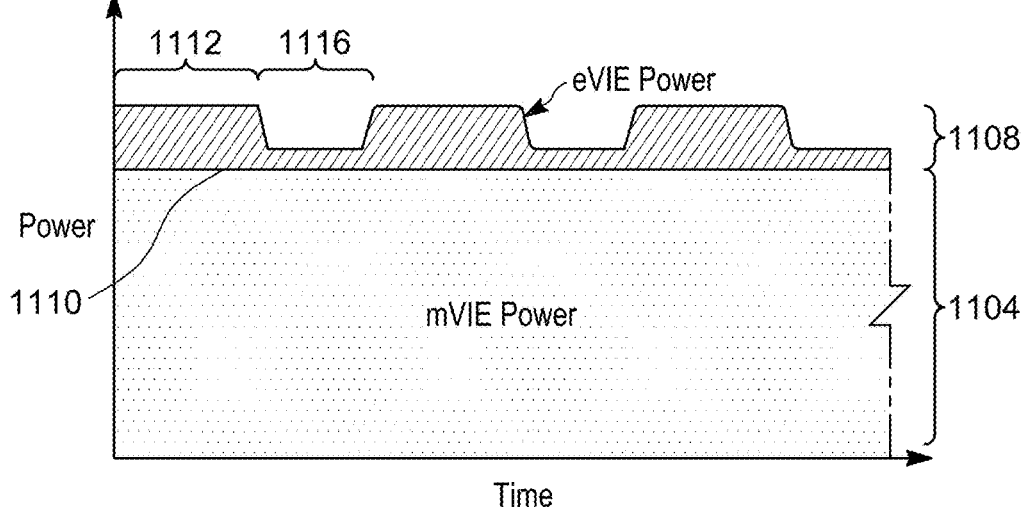
FIG. 11 shows a plot of power load sharing between a mVIE and an eVIE according to various embodiments of the present disclosure.

For example, and as shown in FIG. 11, mVIE handles most of the power flow, as indicated by region 1104. A controller such as matching controller 830, 1030 of FIGS. 8-10 may be used to determine the amount of power handled by mVIE. This amount of power is represented by line 1110 in FIG. 11. In various embodiments, line 1110 may define a steady state operating point (e.g., an optimized position) of mVIE, Additionally, eVIE handles fast transitions or transients in power between low and high-power states within a pulse (when the pulse is ON), as indicated by region 1108. In FIG. high-power states are represented by region 1112, and low-power states are represented by region 1116. In various embodiments, line 1110 may be selectively positioned (e.g., by controlling mVIE) in the center of the eVIE operating range, or may be skewed to one side of the eVIE operating range. In some embodiments, the center of the eVIE operating range or another position (e.g., skewed to one side) of the eVIE operating range may represent an optimized position of the eVIE.

Figure 12:
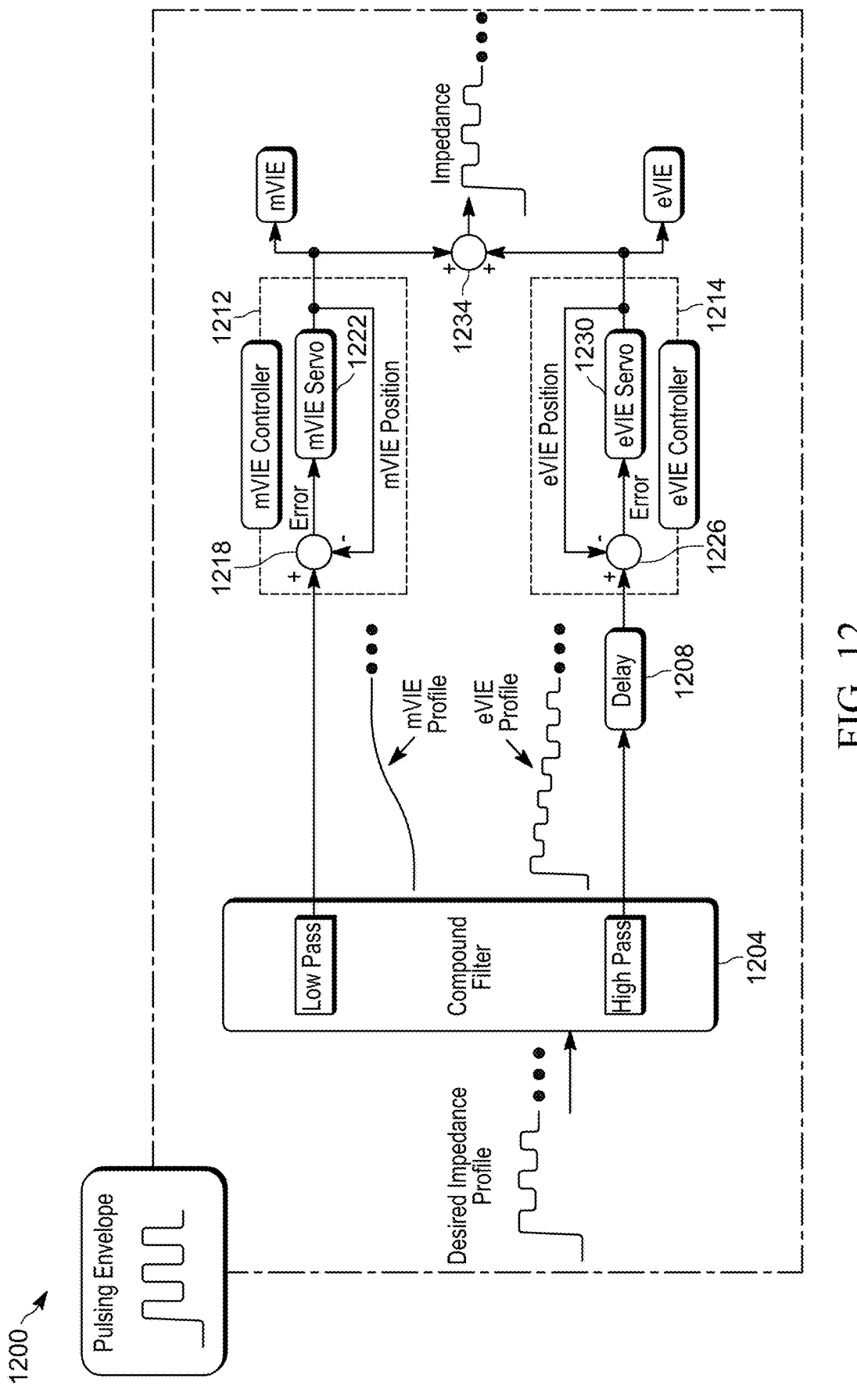
FIG. 12 is a functional control block diagram for controlling a mVIE and an eVIE according to various embodiments of the present disclosure.

FIG. 12 depicts an example a hVIM controller 1200 for controlling a mVIE and an eVIE of a hVIM, such as any one of the hVIMs shown in FIGS. 3-10. As shown, hVIM controller 1200 includes a compound filter 1204, a mVIE controller 1212, an eVIE controller 1214, and a summer 1234. mVIE controller 1212 includes an error detector 1218 and a mVIE servomechanism (servo) 1222, and eVIE controller 1214 includes an error detector 1226 and an eVIE servomechanism (servo) 1230. In various embodiments, mVIE controller 1212 and/or eVIE controller 1214 may be implemented with a PI controller, a PID controller, etc.

As shown in FIG. 12, a desired impedance profile is received by the compound filter 1204 according to a pulsing envelope. For example, in a pulsed RF plasma recipe, a load impedance typically changes with the pulse state due to recipe parameter changes such as power, gas, pressure, etc. This changing load impedance (e.g., at a beginning of a pulse and during stages within a pulse) is shown in the desired impedance profile provided to the compound filter 1204.

Filter 1204 includes a low pass structure and a high pass structure. The low pass structure provides mVIE set points to error detector 1218 and the high pass structure provides eVIE set points to error detector 1226 (via an optional delay 1208) based on the received impedance profile. The changing mVIE and eVIE set points are shown by example mVIE and eVIE profiles in FIG. 12.

In mVIE controller 1212, error detector 1218 compares a received mVIE set point and an output of mVIE servo 1222, and provides an error signal to mVIE servo 1222. Likewise, in eVIE controller 1214, error detector 1226 compares a received eVIE set point and an output of eVIE servo 1230, and provides an error signal to eVIE servo 1230. mVIE servo 1222 and eVIE servo 1230 then generate output signals based on the received error signals. The output signals of mVIE servo 1222 and eVIE servo 1230 are provided to a mVIE actuator and an eVIE actuator for dynamically adjusting impedances of a mVIE and an eVIE, respectively, as explained herein. As shown, outputs of mVIE servo 1222 and eVIE servo 1230, when combined at summer 1234, generate the desired impedance profile.

In various embodiments, the high pass structure may provide eVIE set points to error detector 1226 via delay 1208, as explained above. This may delay the eVIE from adjusting its impedance until the mVIE reaches its steady state, and protect the eVIE from high power levels.

By employing hVIM controller 1200 in plasma load application, changes in load impedance may be adequately compensated. For example, upon plasma ignition, the eVIE may quickly try to compensate for the overall impedance change request, but as the slower mVIE begins to respond, the eVIE excursions will be reduced. Eventually the mVIE will reach a steady-state operating point and the eVIE will primarily compensate for only the state-to-state impedance changes within a pulse when the pulse is ON.

Figure 13:
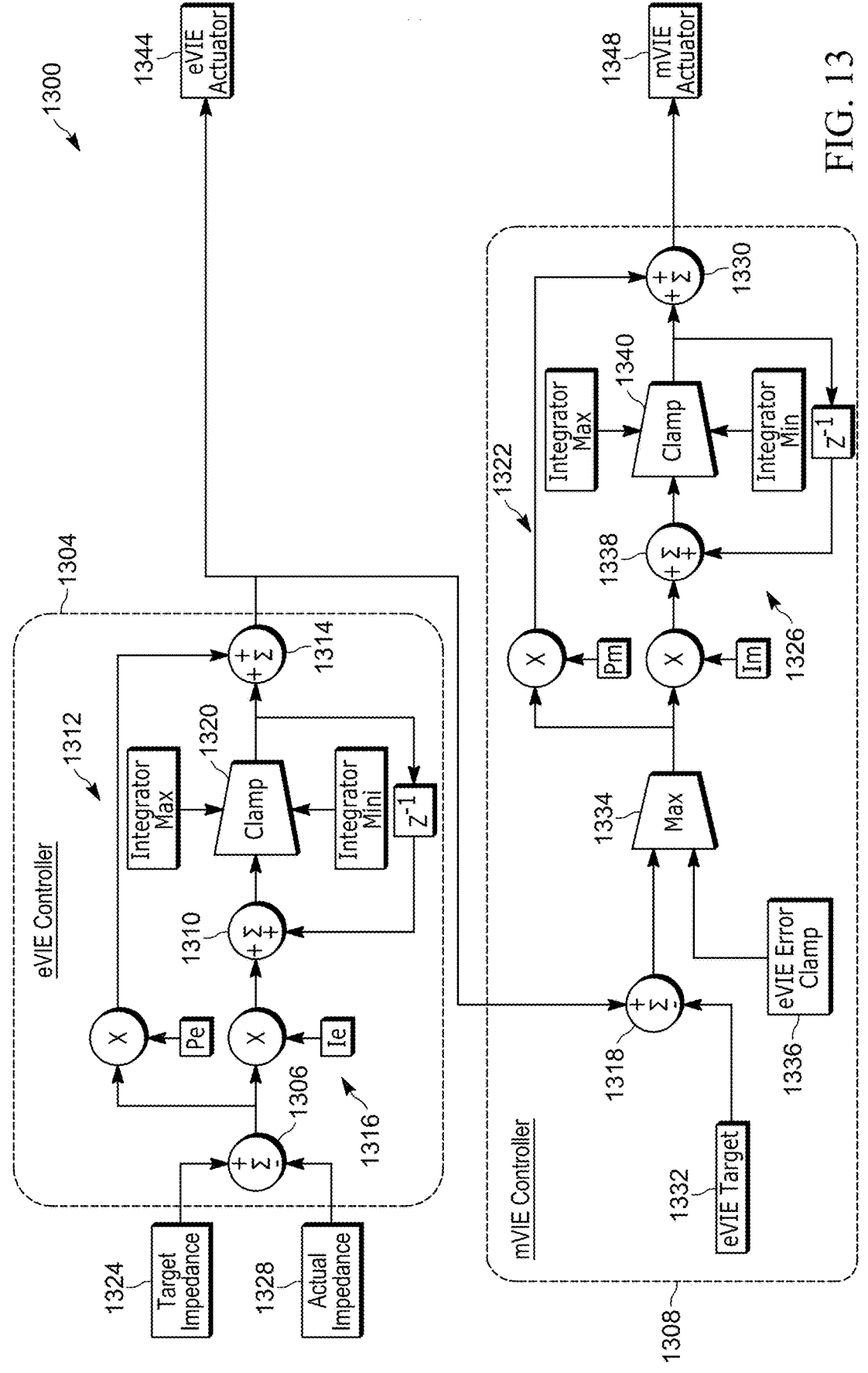
FIG. 13 is a functional block diagram of a control loop having PI controllers for controlling a mVIE and an eVIE according to various embodiments of the present disclosure.

FIG. 13 depicts an example control loop 1300 for controlling an eVIE actuator 1344 and a mVIE actuator 1348 of a hVIM, such as any one of the hVIMs shown in FIGS. 3-10. As shown, control loop 1300 includes an eVIE controller 1304 and a mVIE controller 1308. In FIG. 13, eVIE controller 1304 and mVIE controller 1308 are PI controllers. In other various embodiments, eVIE controller 1304 and/or mVIE controller 1308 may be implemented with another suitable controller such as a PID controller.

As shown, eVIE controller 1304 includes an error detector 1306, and summers 1310, 1314, and a clamp 1320. Error detector 1306 receives signals 1324, 1328 representing a target impedance and an actual impedance. In various embodiments, the target impedance may be set to an impedance value where an eVIE operates in a steady state (e.g., an optimized position of the eVIE). Error detector 1306 compares signals 1324, 1328, and outputs an error signal. The error signal is passed through a proportional loop 1312 and an integral loop 1316 of eVIE controller 1304.

In proportional loop 1312, the error signal is multiplied by a proportional gain Pe. The resulting modified error signal is then provided to summer 1314.

In integral loop 1316, the error signal is multiplied by an integral gain Ie, and the resulting modified error signal is provided to summer 1310. Summer 1310 adds the modified error signal and an output signal of clamp 1320, In various embodiments, output signal of clamp 1320 may pass through a delay $Z^{-1}$ as shown in FIG. 13.

Clamp 1320 receives an output of summer 1310, and integrator max and min values. In various embodiments, integrator max and min values are selected based on eVIE parameters to provide safe operating conditions for eVIE. For example, clamp 1320 may function as a slew rate limiter to limit a rate of change (in both a positive and negative direction) of eVIE based on integrator max and min values.

This may be beneficial if, for example, the integral gain Ie becomes high. Clamp 1320 outputs a signal to summer 1314, which adds the modified error signal from proportional loop 1312 and the output signal of clamp 1320 from integral loop 1316. An output of summer 1314 is provided to an eVIE actuator 1344 for adjusting an impedance of an eVIE, as explained herein.

As shown in FIG. 13, mVIE controller 1308 includes an error detector 1318, a max identifier block 1334, summers 1330, 1338, and a clamp 1340. Error detector 1318 receives the output signal of summer 1314 from eVIE controller 1304 and a signal. 1332 representing an eVIE target impedance. In various embodiments, eVIE target impedance of mVIE controller 1308 may be the same or different than target impedance of eVIE controller 1304.

Error detector 1318 compares the output signal of summer 1314 from eVIE controller 1304 and signal 1332, and outputs an error signal. By comparing such signals, the error signal generated by error detector 1318 may have a minimal error value falling in a center portion of the operating range of eVIE. This may, for example, allow the slower mVIE actuator 1348 to maintain the faster eVIE actuator 1344 at its target position.

The error signal from error detector 1318 is passed to max identifier block 1334. Max identifier block 1334 receives the error signal and a signal from eVIE error clamp 1336, and outputs a signal based on these signals. In various embodiments, eVIE error clamp 1336 may function as a slew rate limiter to limit a rate of change (in one direction) of an mVIE based on the eVIE. The output signal of max identifier block 1334 is passed through a proportional loop 1322 and an integral loop 1326 of mVIE controller 1308.

In proportional loop 1322, the output signal of max identifier block 1334 is multiplied by a proportional gain Pm. The resulting modified signal is then provided to summer 1330.

In integral loop 1326, the output signal of max identifier block 1334 is multiplied by an integral, gain Im, and the resulting modified signal is provided to summer 1338. Summer 1338 adds the modified signal and an output signal of clamp 1340. In various embodiments, output signal of clamp 1340 may pass through a delay $Z^{-1}$ as shown in FIG. 13.

Clamp 1340 receives an output of summer 1338, and integrator max and min values. Clamp 1340 of mVIE controller 1308 functions in a similar manner as clamp 1320 of eVIE controller 1304. For example, integrator max and min values are selected based on mVIE parameters to provide safe operating conditions (e.g., limited rates of change) for mVIE. Clamp 1340 outputs a signal to summer 1330, which adds the modified signal from proportional loop 1322 and the output signal of clamp 1340 from integral, loop 1326. An output of summer 1330 is provided to a mVIE actuator 1348 for adjusting an impedance of a mVIE, as explained herein.

Figure 14:
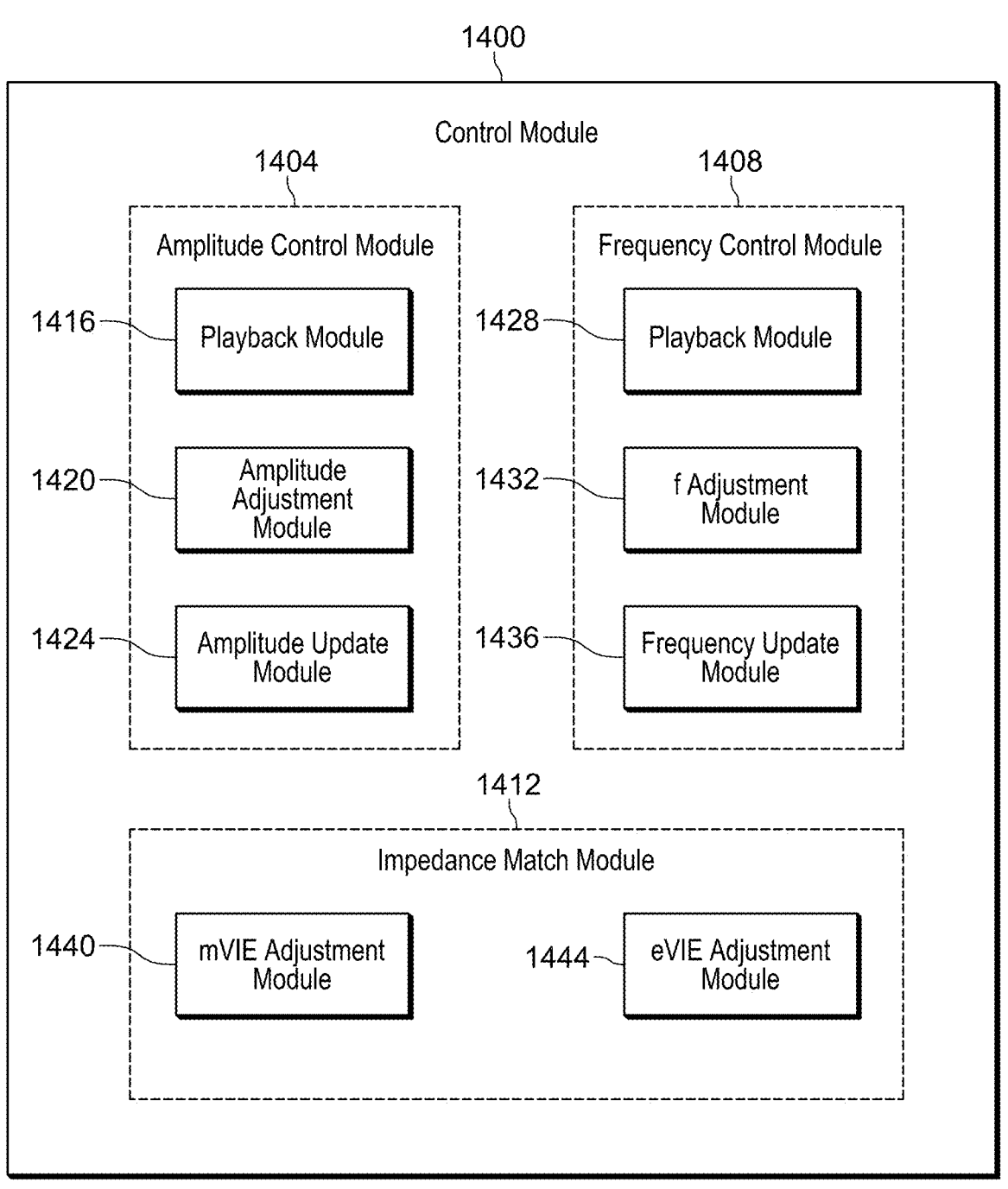
FIG. 14 shows a functional block diagram of an example control module arranged in accordance with various embodiments.

FIG. 14 incorporates various components of the prior figures, Control module 1400 of FIG. 14 may include power generation module section and impedance match module section. Power generation module section includes a RF amplitude control module 1404 and a RF frequency control module 1408. RF amplitude control module 1404 includes a playback module 1416, an amplitude adjustment module 1420, and an amplitude update module 1424. RF frequency control module 1408 includes a playback module 1428, a frequency adjustment module 1432, and a frequency update module 1436. Impedance match module section includes an impedance match module 1412 having a mVIE adjustment module 1440 and an eVIE adjustment module 1444. In various embodiments, control module 1400 includes one or a plurality of processors that execute code associated with the module sections or modules 1400, 1404, 1408, 1412, 1416, 1420, 1424, 1428, 1432, 1436, 1440, and 1444. Operation of at least the module sections or modules 1400, 1412, 1440, and 1444 is described below with respect to the example method of FIG. 15.

For further defined structure of the controllers and modules described herein, see the below provided flow chart of FIG. 15 and the below provided definition for the term "module". The systems disclosed herein may be operated using numerous methods, examples, and various control system methods of which are illustrated in FIGS. 1, 8-10 and 12-13. Although the following operations are primarily described with respect to the implementation of FIG. 8, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 15:
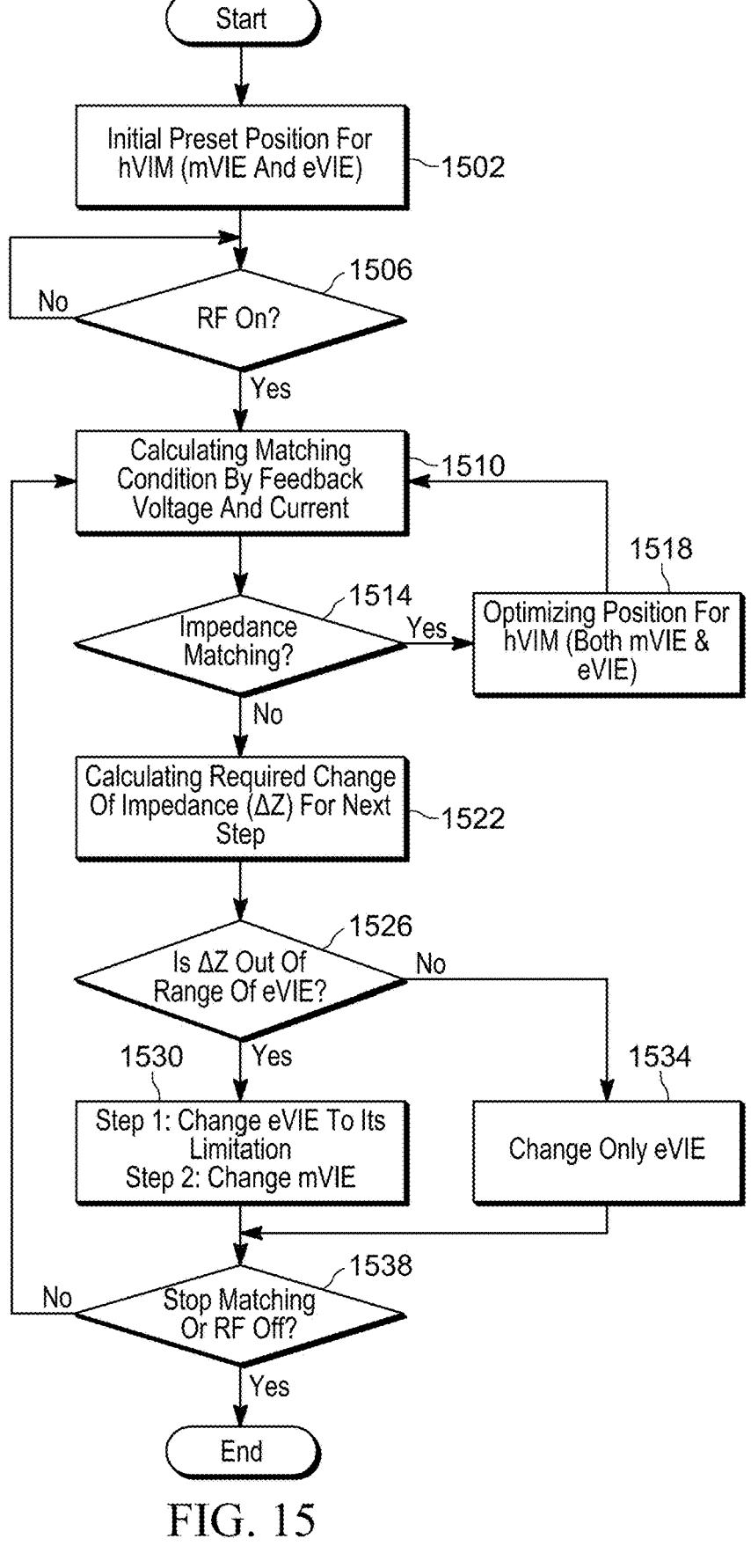
FIG. 15 shows a flow chart of operation of a control system for performing mode-based impedance control arranged in accordance with the principles of the present disclosure.

FIG. 15 shows a flow chart of a control system for performing mode-based impedance control for, for example, the power delivery system of FIG. 8. Control begins and proceeds to block 1502. At block 1502, control determines initial preset positions for a mVIE (e.g., mVIE 302) and an eVIE (e.g., eVIE 304) in a hVIM of a matching network (e.g., such as first hVIM 300 of the matching network 800 in FIG. 8). Control then outputs the initial preset positions to block 1506. At block 1506, control determines whether a pulse is ON (e.g., a pulse used to modulate a RF signal provided by a RF generator). If so, control proceeds to block 1510; otherwise, control returns to block 1506.

At block 1510, control calculates a matching condition by one or more feedback voltage and current signals. In various embodiments, the matching condition may be found based on an optimal frequency that provides minimum reflected power. The minimum reflected power may be indicated through a minimum magnitude of the measured complex reflection coefficient gamma, $|\Gamma|$. Block 1510 outputs the matching condition to block 1514.

At block 1514, control determines whether impedance matching is present between an input side of the matching network (or in some cases, the hVIM) and the characteristic impedance of the transmission line and generator. If so, control optionally proceeds to block 1518; otherwise, control proceeds to block 1522. At block 1518, control determines if both mVIE and eVIE of the hVIM are at optimized positions. If not, the impedance of mVIE and the impedance of eVIE are adjusted to place both mVIE and eVIE at their optimized positions (e.g., at steady state operating points of the mVIE and eVIE), while maintaining the total impedance of the matching network (or the hVIM) unchanged.

For example, after a matched condition is achieved, determined, etc. at block 1510 (e.g., a standing wave ratio (SWR) of a transformed load impedance to the characteristic impedance of the transmission line and generator is less than a specific value such as 1.05), an optimizing positioning function may become activated to relocate the working position of both mVIE and eVIE to their optimized positions, while maintaining the total impedance of the hVIM unchanged. For instance, at a matched condition, if eVIE is working close to its range boundary, the optimizing positioning function may re-position the eVIE to the middle of its range (e.g., by changing the impedance of eVIE), while simultaneously moving mVIE to a new position (e.g., by changing the impedance of mVIE) to ensure the SWR/matching condition is unchanged. In other words, the overall hVIM impedance doesn't change.

Control then returns to block 1510. At block 1522, control calculates a required change in impedance (AZ) for achieving impedance matching. Block 1522 outputs the change in impedance (AZ) to block 1526. At block 1526, control determines whether the change in impedance (AZ) is out of a range of eVIE. If so, control proceeds to block 1530; otherwise, control proceeds to block 1534.

At 1530, control adjusts both mVIE and eVIE. In various embodiments, if the required change in impedance (AZ) is outside of the eVIE range in block 1526, changes are made to both mVIE and eVIE to adjust their impendences and achieve a matching condition. In such scenarios, eVIE may be adjusted to work at its boundary or limit (e.g., at a min/max capacitance/impedance value) to increase the matching speed since eVIE is faster than mVIE. The remaining impedance will be slowly compensated by mVIE. This scenario (e.g., control loop) will work until the required change in impedance (AZ) is within the eVIE range in block 1526.

At 1534, control adjusts only eVIE. For example, if the required change in impedance (ΔZ) is within the eVIE range in block 1526, changes are made only to eVIE to adjust its impendence and achieve a matching condition. In such scenarios, the required change of impedance (ΔZ) is fully controlled by the faster responding eVIE.

After adjustments are made to both mVIE and eVIE in block 1530 or to only eVIE in block 1534, control proceeds to block 1538. At block 1538, control determines whether to stop its impedance matching process or whether the pulse is OFF. If no to either condition, control returns to block 1510 (explained above). If either condition is present, control ends.

Although specific implementations of controllers are described herein for performing, for example, mode-based impedance control, it should be apparent that any suitable control implementation may be employed. For example, in various embodiments, any one of controllers disclosed herein may implement a multiple input, multiple output (MIMO) control system, a single-input and single-output (SISO) control system, etc. Additionally, in various embodiments, any one of controllers disclosed here may implement artificial intelligence (AI) control techniques, machine learning (ML) techniques, etc.

Employing any one of the hVIMs and associated control techniques explained herein may result in various advantages. For example, hVIMs and associated control techniques combine the high bandwidth benefits an eVIE, with the high-power handling and broad impedance range capabilities of a mVIE to enable a tunable module with overall, broader power handling, tuning range and tuning speed. Additionally, in various embodiments, hVIMs and associated control techniques may improve RF powered electrode plasma sheath formation and evolution by replacing matching network tuning elements with hVIMs which have very fast response times. Further, in various embodiments, hVIMs and associated control techniques may enable maximum power delivery during RF pulsed operation to a load under steady state or transient operation when used as part of a matching network. Moreover, in various embodiments, hVIMs and associated control techniques may minimize stress on RF generators and/or power supply systems under transient conditions, minimize non-linear plasma load influence on generator control dynamics, improve pulse to pulse stability, etc.

The hVIMs and associated control techniques explained herein may be employed in numerous applications. In various embodiments, the hVIMs and associated control techniques may be employed in matching networks in plasma load applications. For example, plasma etch and deposition applications with high power and narrow pulsed RF recipes would greatly benefit from using the hVIMs in place of typical tunable capacitors or inductors found in matching networks.

Although the hVIMs and associated control techniques may be employed in matching networks as explained herein, it should be apparent that the hVIMs may be employed in any suitable application, such as an application having variable impedance elements, high-power, changing (e.g., nonlinear) loads, etc. For example, in various embodiments, the hVIMs may be employed in low power atomic layer etch (ALE) applications. In such scenarios, ALE applications would greatly benefit from a high-speed match since the ion energy needs to be very well defined. A fast-tuning match can prevent power overshoot at pulse edges, and enables the power to quickly reach its steady state value, thus allowing for an overall wider and more defined process window (e.g., shorter pulses, higher pulse rates).

Additionally, in various embodiments, the hVIMs may be employed in multi-frequency systems. In such scenarios, multi-frequency systems would greatly benefit from the use of the hVIMs by mitigating intermodulation distortion (IMD) which arises from the multiple frequencies mixing in the plasma and becomes very detrimental at higher operating powers. Typically, the higher frequency generator in this arrangement, sees an impedance variation at the frequency of the lower frequency generator. Typical mVIE based matching networks cannot tune fast enough to compensate for this, and matching networks based on eVIEs cannot handle the higher power operation. With the fast eVIEs, it could be possible to tune during the low frequency cycle so that the high frequency generator sees a nearly perfect match.

Moreover, in various embodiments, the hVIMs may be employed in communications applications. For example, the hVIMs may be used with antenna tuners for radio transmitters.

Further, in various embodiments, the hVIMs may be employed in various high-power pulse applications. For example, applications may have very high-power pulse states that may exceed the current capabilities of eVIEs. By implementing the hVIMs, the high-power states may be supported by the mVIE component, while simultaneously being able to tune across all states afforded by the high speed eVIE component.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B, This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit" In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s), Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level cache on or near a microprocessor die, which may store code from multiple modules. Another example of shared memory hardware may be persistent storage, such as a solid state drive (SSD), Which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl Pascal, Curl, ° Canal, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual. Basic®, Lua, MATLAB, SIMULINK, and Python®.

What is claimed is:

1. A power supply system for powering a load, the power supply system comprising:
   a RF generator including a RF power source configured to output a RF signal;

a matching network coupled between the RF generator and the load, wherein the matching network includes at least one mechanically variable impedance element and at least one electrically variable impedance element; and
   a control module coupled to the matching network and configured to generate one or more signals to adjust at least one of an impedance of the mechanically variable impedance element or an impedance of the electrically variable impedance element to vary an impedance match between an input side of the matching network and the RF generator,
   wherein the at least one electrically variable impedance element includes a plurality of switching cells, each switching cell comprising a fixed capacitor and a switch, and
   wherein the control module is further configured to operate at least one of the switches at a RF frequency with an adjustable duty cycle to modulate an impedance of the corresponding fixed capacitor.

2. The power supply system of claim 1, wherein the at least one mechanically variable impedance element includes at least one of a capacitive component or an inductive component, and wherein the at least one electrically variable impedance element includes at least one of an inductive component or a capacitive component.

3. The power supply system of claim 1, wherein the at least one electrically variable impedance element includes one or more varactors, and wherein the control module is configured to adjust an impedance of the one or more varactors based on a bias voltage.

4. The power supply system of claim 1, wherein the matching network includes at least one of a capacitive component or an inductive component coupled to at least one of the mechanically variable impedance element or the electrically variable impedance element.

5. The power supply system of claim 4, wherein the control module is configured to adjust an impedance of the capacitive component or the inductive component by varying a frequency of the RF signal.

6. The power supply system of claim 1, wherein the at least one mechanically variable impedance element and the at least one electrically variable impedance element are coupled in parallel.

7. The power supply system of claim 1, wherein the at least one mechanically variable impedance element and the at least one electrically variable impedance element are coupled in series.

8. The power supply system of claim 1, wherein the at least one mechanically variable impedance element is a first mechanically variable impedance element and the at least one electrically variable impedance element is a first electrically variable impedance element, wherein the matching network includes a second mechanically variable impedance element and a second electrically variable impedance element, and wherein the control module is configured to generate one or more signals to adjust at least one of an impedance of the second mechanically variable impedance element or an impedance of the second electrically variable impedance element.

9. A hybrid variable impedance module comprising:
   at least one mechanically variable impedance element;
   at least one electrically variable impedance element; and
   a control module coupled to at least one of the mechanically variable impedance element or the electrically variable impedance element, wherein the control module is configured to generate one or more signals to adjust at least one of an impedance of the mechanically variable impedance element or an impedance of the electrically variable impedance element;

wherein the at least one electrically variable impedance element includes a plurality of switching cells, each switching cell comprising a fixed capacitor and a switch, and wherein the control module is further configured to operate at least one of the switches at a RF frequency with an adjustable duty cycle to modulate an impedance of the corresponding fixed capacitor.

10. The hybrid variable impedance module of claim 9, wherein the at least one mechanically variable impedance element and the at least one electrically variable impedance element are coupled in parallel.

11. The hybrid variable impedance module of claim 9, wherein the at least one mechanically variable impedance element and the at least one electrically variable impedance element are coupled in series.

12. The hybrid variable impedance module of claim 9, wherein the at least one mechanically variable impedance element includes at least one of a capacitive component or an inductive component.

13. The hybrid variable impedance module of claim 12, wherein the at least one electrically variable impedance element includes at least one of an inductive component, a capacitive component, or a varactor.

14. The hybrid variable impedance module of claim 9, further comprising at least one of a capacitive component or an inductive component coupled to at least one of the mechanically variable impedance element or the electrically variable impedance element of the hybrid variable impedance module.

15. A matching network comprising the hybrid variable impedance module of claim 9, wherein the matching network is configured to couple between a RF power source and a load.

16. The matching network of claim 15, further comprising at least one of a capacitive component or an inductive component coupled to at least one of the mechanically variable impedance element or the electrically variable impedance element.

17. The matching network of claim 16, wherein the matching network is configured to receive an RF signal from the RF power source, and wherein the control module is configured to adjust an impedance of the capacitive component or the inductive component by varying a frequency of the RF signal.

18. The matching network of claim 15, wherein the hybrid variable impedance module is a first hybrid variable impedance module, wherein the matching network further comprises a second hybrid variable impedance module coupled to the first hybrid variable impedance module, and wherein the second hybrid variable impedance module includes at least one mechanically variable impedance element and at least one electrically variable impedance element.

19. A non-transitory computer-readable medium storing instructions, the instructions comprising:

receiving, at a matching network, a RF signal from a RF power source, wherein the matching network includes at least one mechanically variable impedance element and at least one electrically variable impedance element;

in response to receiving the RF signal, determining whether an impedance match is present between an input side of the matching network and a load coupled to the matching network; and if the impedance match is not present, adjusting an impedance of the matching network to achieve the impedance match by changing at least one of an impedance of the at least one mechanically variable impedance element or an impedance of the at least one electrically variable impedance element;

wherein the at least one electrically variable impedance element includes a plurality of switching cells, each switching cell comprising a fixed capacitor and a switch, wherein changing the impedance of the at least one electrically variable impedance element includes operating at least one of the switches at a RF frequency with an adjustable duty cycle to modulate an impedance of the corresponding fixed capacitor.

20. The non-transitory computer-readable medium storing instructions of claim 19, the instructions further comprising calculating a change in impedance of the matching network to achieve the impedance match.

21. The non-transitory computer-readable medium storing instructions of claim 20, the instructions further comprising determining if the change in impedance of the matching network to achieve the impedance match is within an operable range of the at least one electrically variable impedance element.

22. The non-transitory computer-readable medium storing instructions of claim 21, wherein adjusting the impedance of the matching network to achieve the impedance match includes only changing the impedance of the at least one electrically variable impedance element, in response to determining the change in impedance of the matching network to achieve the impedance match is within the operable range of the at least one electrically variable impedance element.

23. The non-transitory computer-readable medium storing instructions of claim 21, wherein adjusting the impedance of the matching network to achieve the impedance match includes changing the impedance of the at least one mechanically variable impedance element and the impedance of the at least one electrically variable impedance element, in response to determining the change in impedance of the matching network to achieve the impedance match is outside the operable range of the at least one electrically variable impedance element.

24. The non-transitory computer-readable medium storing instructions of claim 19, the instructions further comprising, if the impedance match is present, changing the impedance of the at least one mechanically variable impedance element so that the at least one mechanically variable impedance element is operating at an optimized position within an operable range of the at least one mechanically variable impedance element.

25. The non-transitory computer-readable medium storing instructions of claim 24, the instructions further comprising, if the impedance match is present, changing the impedance of the at least one electrically variable impedance element so that the at least one electrically variable impedance element is operating at an optimized position within an operable range of the at least one electrically variable impedance element.

26. The non-transitory computer-readable medium storing instructions of claim 19, wherein the at least one electrically variable impedance element includes one or more varactors and wherein changing the impedance of the at least one electrically variable impedance element includes adjusting a bias voltage applied to the one or more varactors to change the impedance of the electrically variable impedance element.

27. The non-transitory computer-readable medium storing instructions of claim 19, wherein the matching network includes at least one of a capacitive component or an inductive component coupled to at least one of the mechanically variable impedance element or the electrically variable impedance element.

28. The non-transitory computer-readable medium storing instructions of claim 27, wherein adjusting the impedance of the matching network includes varying a frequency of the RF signal to adjust an impedance of the capacitive component or the inductive component.

29. The non-transitory computer-readable medium storing instructions of claim 19, the instructions further comprising, if the impedance match is present, changing the impedance of the at least one electrically variable impedance element so that the at least one electrically variable impedance element is operating at an optimized position within an operable range of the at least one electrically variable impedance element.

30. A power supply system for powering a load, the power supply system comprising:

a RF generator including a RF power source configured to output a RF signal;

a matching network coupled between the RF generator and the load, wherein the matching network includes at least one mechanically variable impedance element and at least one electrically variable impedance element; and a control module coupled to the matching network and configured to generate one or more signals to adjust at least one of an impedance of the mechanically variable impedance element or an impedance of the electrically variable impedance element to vary an impedance match between an input side of the matching network and the RF generator, wherein the at least one electrically variable impedance element includes one or more varactors and a plurality of capacitors coupled between the RF generator and the one or more varactors, wherein the control module is configured to adjust an impedance of the one or more varactors based on a bias voltage.

31. A hybrid variable impedance module comprising:

at least one mechanically variable impedance element;

at least one electrically variable impedance element; and a control module coupled to at least one of the mechanically variable impedance element or the electrically variable impedance element, wherein the control module is configured to generate one or more signals to adjust at least one of an impedance of the mechanically variable impedance element or an impedance of the electrically variable impedance element, wherein the at least one electrically variable impedance element includes a varactor and a plurality of capacitors, wherein each of the plurality of capacitors is coupled to a respective electrode of the varactor.

* * * * *